United States Patent [19]
Komoriya et al.

[11] Patent Number: 5,400,503
[45] Date of Patent: Mar. 28, 1995

[54] WIRING METHOD AND WIRING APPARATUS

[75] Inventors: Hitoshi Komoriya; Akihiko Yabuki; Kouichi Oikawa, all of Kawasaki, Japan

[73] Assignee: Fujitsu Limited, Kanagawa, Japan

[21] Appl. No.: 90,275

[22] Filed: Jul. 13, 1993

[30] Foreign Application Priority Data

| Jul. 31, 1992 | [JP] | Japan | 4-204170 |
| Aug. 25, 1992 | [JP] | Japan | 4-224476 |
| Aug. 28, 1992 | [JP] | Japan | 4-229041 |
| Dec. 28, 1992 | [JP] | Japan | 4-349333 |
| May 25, 1993 | [JP] | Japan | 5-122922 |

[51] Int. Cl.⁶ .................. H01K 3/10; B23P 19/00
[52] U.S. Cl. .................. 29/850; 29/745; 29/33 F; 228/4.5
[58] Field of Search .......... 29/846, 860, 850, 867, 29/745, 33 F; 228/4.5

[56] References Cited

U.S. PATENT DOCUMENTS

| 3,593,906 | 7/1971 | Hug | 29/846 X |
| 4,075,758 | 2/1978 | Parsons et al. | 29/867 X |
| 4,437,603 | 3/1984 | Kobayashi et al. | 228/4.5 |
| 4,691,855 | 9/1987 | Yagi | 228/4.5 |
| 4,987,678 | 1/1991 | Satterfield et al. | 29/850 X |

FOREIGN PATENT DOCUMENTS

| 55-53482 | 4/1980 | Japan. |
| 57-153493 | 9/1982 | Japan. |
| 1-110800 | 4/1989 | Japan. |
| 1-136396 | 5/1989 | Japan. |

OTHER PUBLICATIONS

"Automated Twisted-Pair Wire Bonding", Houser et al., IBM J. Res. Develop., vol. 27, No. 6, Nov. 1983, pp. 598-606.

*Primary Examiner*—Carl J. Arbes
*Attorney, Agent, or Firm*—Nikaido, Marmelstein, Murray & Oram

[57] ABSTRACT

A wiring apparatus includes a preprocessing unit for splitting a starting portion of splitting coated parallel twin wires composed of two coated single wires joined together in parallel form and fed from a wire rounding member into the two coated single wires and removing a part of a coating of each of the coated single wires split, and a bonding unit for separately bonding portions of the two coated single wires from which coatings have been removed to two terminals provided on a body on which the coated parallel twin wires are to be arranged.

19 Claims, 54 Drawing Sheets

$d_1$: ABOUT 60μm
$d_2$: ABOUT 80μm

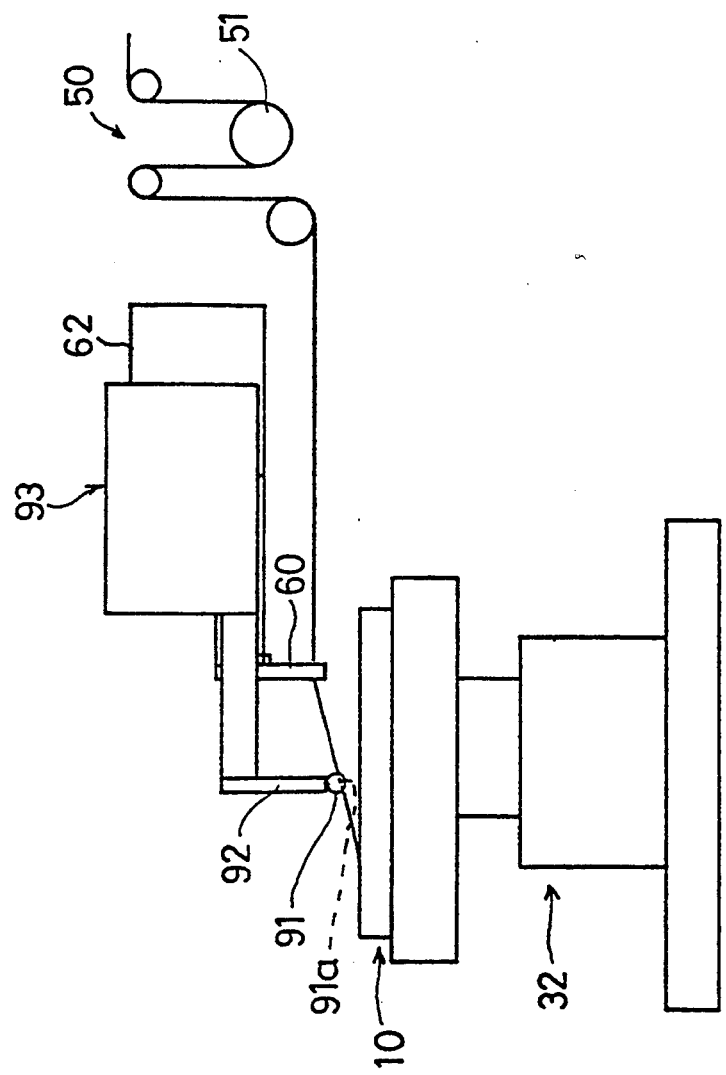

$\Delta D \quad \Delta D = 20 \mu m$

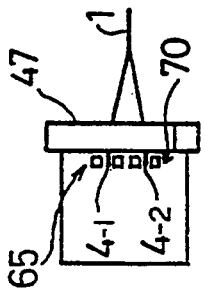
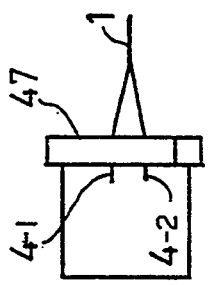
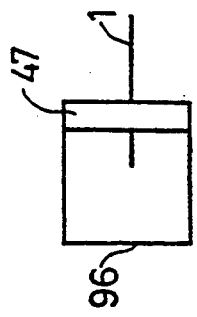
FIG.14A FIG.14B FIG.14C
FIG.14D FIG.14E FIG.14F
FIG.14G
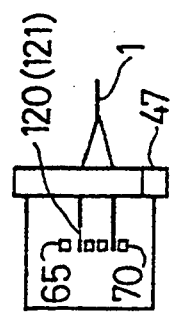
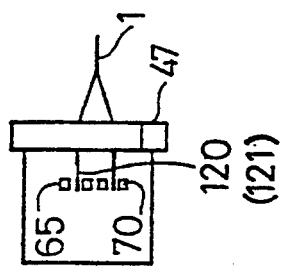
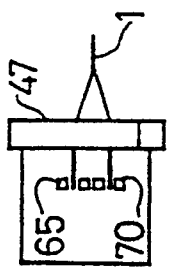
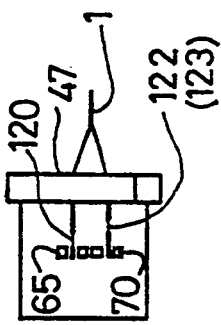

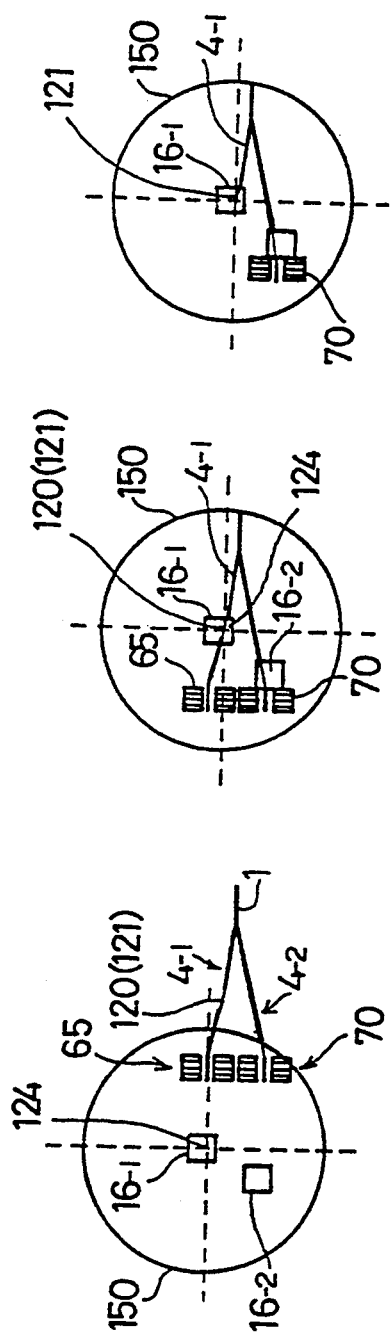

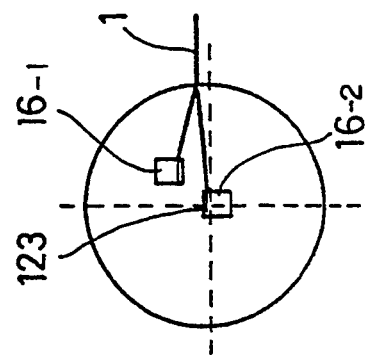
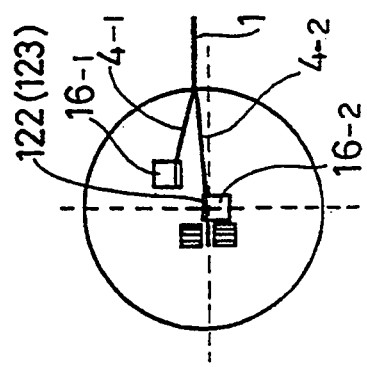
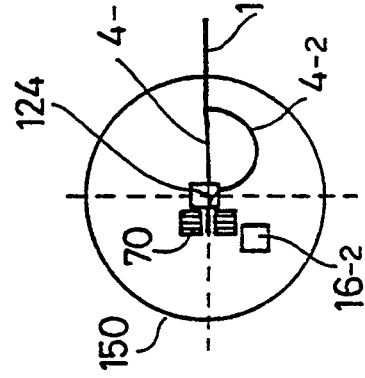

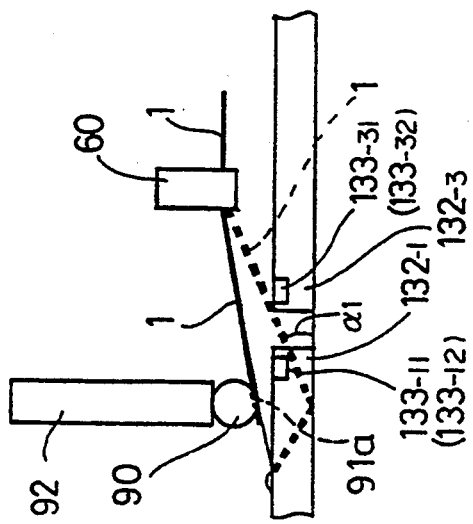
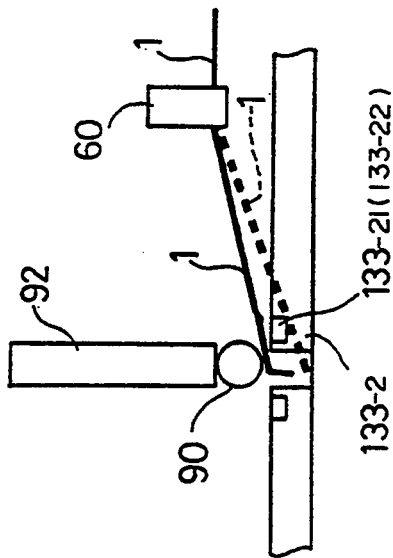
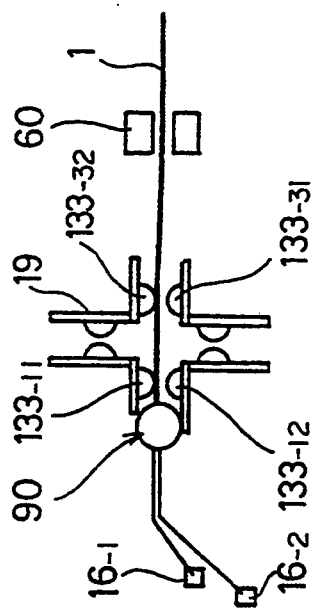
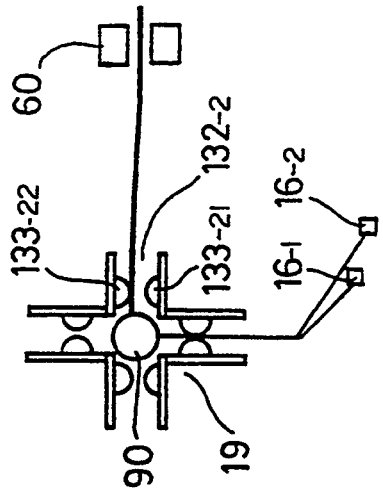

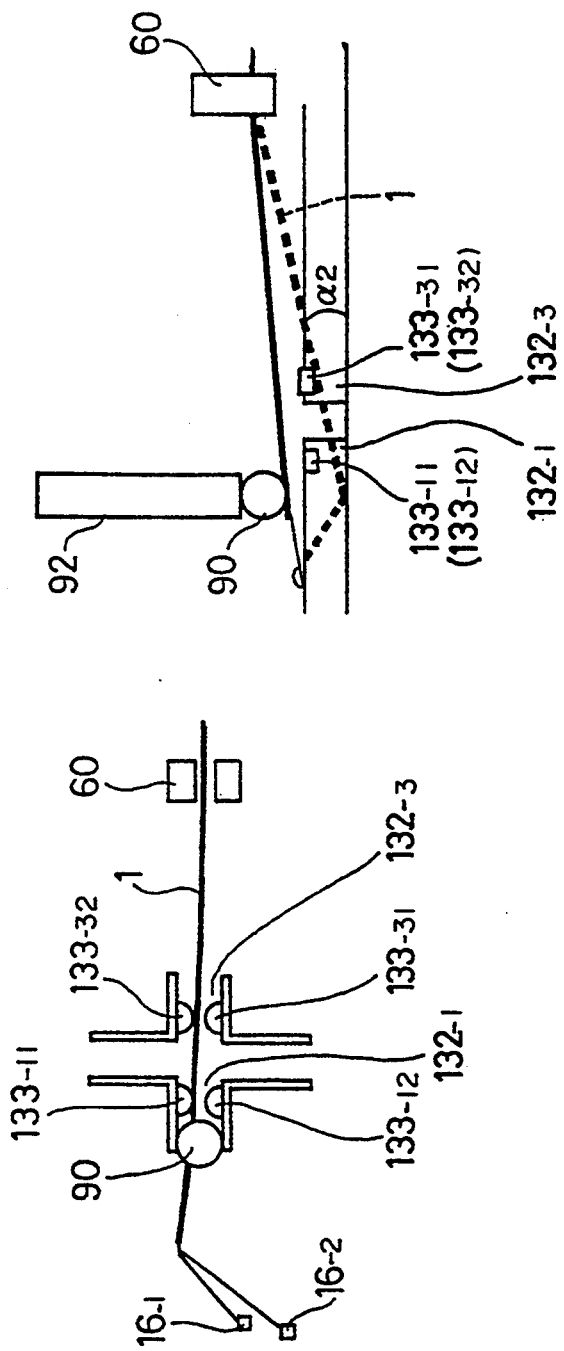

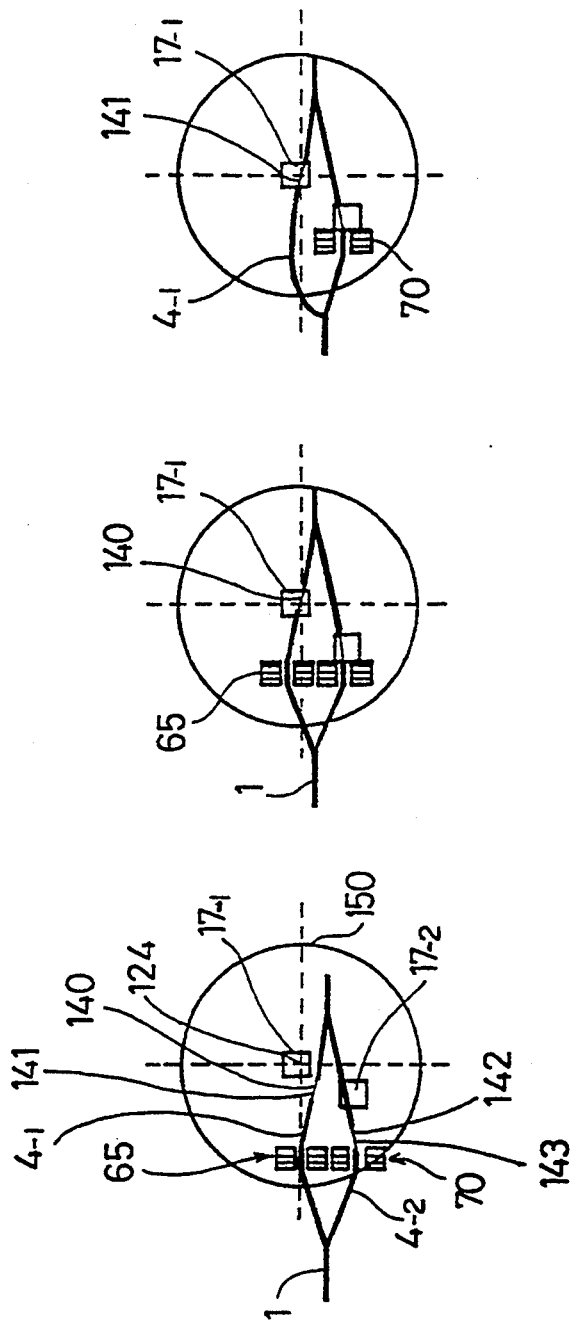

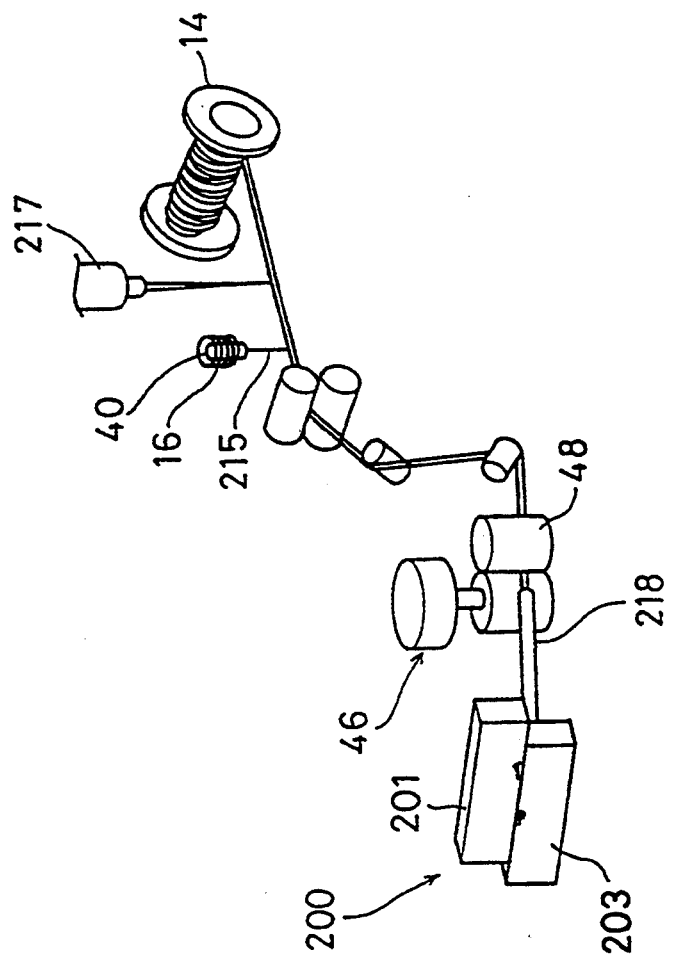

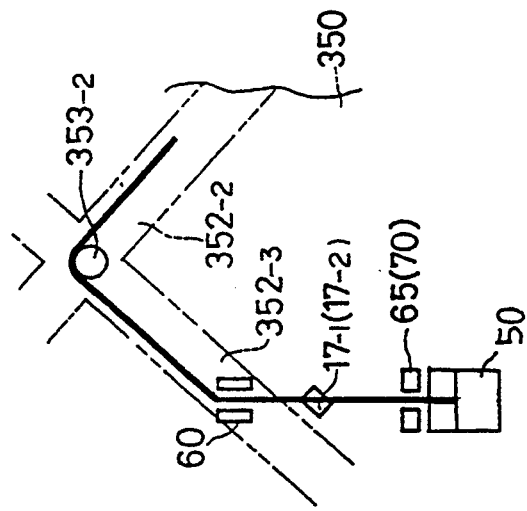
FIG.55C STEPS 382,383
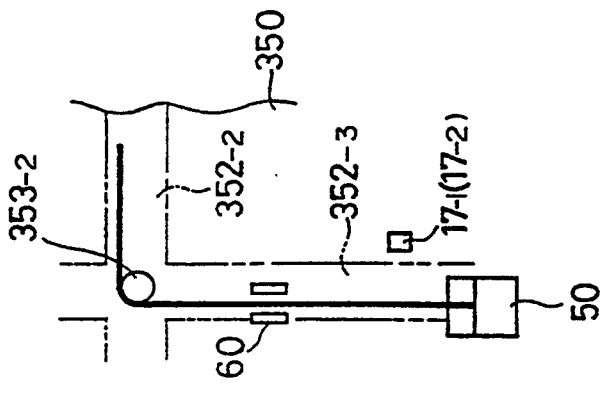
FIG.55B STEP 380
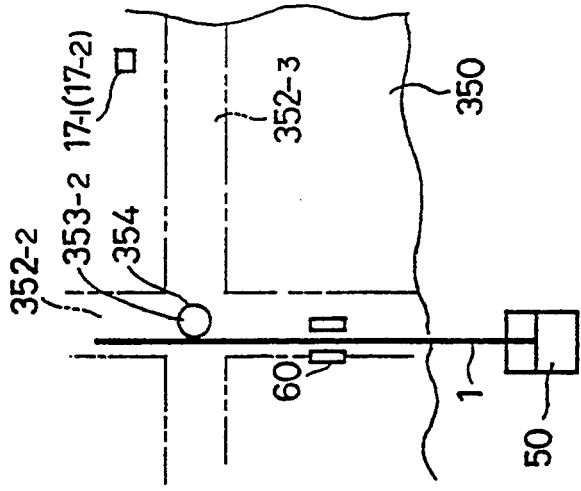
FIG.55A STEP 379

STEPS 384, 385, 386

STEP 389

STEP 391

STEP 392

STEP 393

STEP 394

WIRE AXIS DIRECTION

WIRING METHOD AND WIRING APPARATUS

BACKGROUND OF THE INVENTION

1. Field of the Invention

The present invention generally relates to a coated parallel twin wire wiring method and apparatus for wiring coated parallel twin wires on a printed circuit board of an electronic computer.

Conventionally, in a printed circuit board of an electronic computer, a wire is provided in order to cope with and design change and eliminate defects. Such a wire is coated for establishing electric insulation and is a twin wire member consisting of a signal line and a ground line in order to prevent the influence of noise. In a device using coated twin wires as described above, it is necessary to prevent the printed circuit board from being damaged and to connect the wires to respective desired pads.

2. Description of the Prior Art

An apparatus for automatically connecting coated twin wires to pads or the like is disclosed in IBM J.RES. DEVELOP VOL. 27, NO. 6, NOVEMBER 1983. This automatic wiring apparatus uses a twisted pair line composed of a pair of twisted wires, removes the coating, and simultaneously bonds the two wires by means of heat of a bonder. The pressure of the bonder is as high as approximately 100 gr.

Recent printed circuit boards have a high pattern integration density and have a structure in which wiring patterns are formed on upper and lower surfaces of a thin film made of polyimide and provided in the vicinity of surfaces of the printed circuit boards.

Recently, it has been required that the printed circuit boards use parallel twin wires instead of a pair of twisted wires in order to improve the effect of noise elimination.

Nowadays, the thickness of the polyimide thin film, which has been 30 μm in the past, has become as thin as half of the above past value, namely, 15 μm. If a pressure as large as 100 gr is applied to the polyimide thin film, a thin film part thereof serving as an insulating film may be damaged.

SUMMARY OF THE INVENTION

It is a general object of the present invention to provide a wiring method and apparatus in which the above disadvantage is eliminated.

A more specific object of the present invention is to provide a wiring method and apparatus suitable for recent printed circuit boards, in which coatings of coated parallel twin wires are removed beforehand and the wires are bonded one by one.

The above objects of the present invention are achieved by a wiring method comprising:

a first preprocessing step of splitting a starting portion of splitting coated parallel twin wires composed of two coated single wires joined together in parallel form and fed from a wire rounding member into the two coated single wires and removing a part of a coating of each of the coated single wires split;

a first bonding step of bonding first portions of the two coated single wires from which coatings have been removed to two first terminals provided on a body on which the coated parallel twin wires are to be arranged;

a routing step of routing the coated parallel twin wires on the body.;

a second preprocessing step of splitting an intermediate portion of the coated parallel twin wires into the two coated single wires and removing a part of the coating of each of the coated single wires split at the intermediate portion; and a second bonding step of bonding second portions of the coated single wires from which the coatings have been removed by the second preprocessing step to two second terminals provided on the body and cutting the coated parallel twin wires at the second portions.

The above objects of the present invention are also achieved by a wiring apparatus comprising:

preprocessing means for splitting a starting portion of splitting coated parallel twin wires composed of two coated single wires joined together in parallel form and fed from a wire rounding member into the two coated single wires and removing a part of a coating of each of the coated single wires split; and bonding means, coupled to the preprocessing means, for separately bonding portions of the two coated single wires from which coatings have been removed to two terminals provided on a body on which the coated parallel twin wires are to be arranged.

BRIEF DESCRIPTION OF THE DRAWINGS

Other objects, features and advantages of the present invention will become mope apparent from the following detailed description when read in conjunction with the accompanying drawings, in which:

FIG. 10 is a plan view of a wire pushing-in mechanism;

FIGS. 14A, 14B, 14C, 14D, 14E, 14F and 14G are diagrams of a wiring preprocessing step;

FIGS. 15A, 15B and 15C are diagrams are diagrams of a step for bonding a wire 4-1 to a pad 16-1;

FIGS. 16A, 16B and 16C are diagrams of a step for bonding a wire 4-2 to a pad 16-2;

FIGS. 17A, 17B, 17C and 17D are diagrams of a step for bending the twin wires 90°;

FIGS. 19A and 19B are diagrams of a straight wiring step;

FIGS. 20A, 20B and 20C are diagrams of a step for bonding the wire 4-1 to the pad 17-1;

FIG. 24 is the wire splitting mechanism and associated parts shown in FIG. 22;

FIGS. 55A, 55B and 55C are diagrams of the final stage of the routing step;

DESCRIPTION OF THE PREFERRED EMBODIMENTS

A description will now be given of embodiments of the present invention with reference to the accompanying drawings.

COATED PARALLEL TWIN WIRES 1 AND WIRING STATE THEREOF

In order to facilitate understanding the present invention, a description will now be given of coated parallel twin wires and a wiring state thereof.

Figure 1:
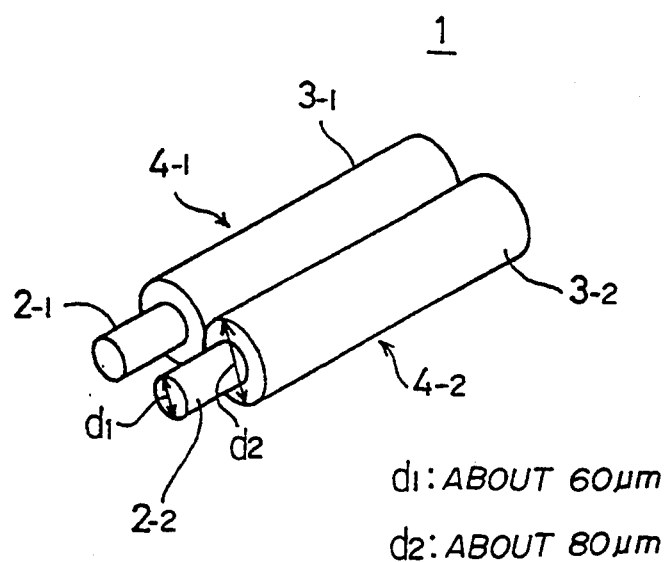
FIG. 1 is a perspective diagram of coated parallel twin wires.

As shown in FIG. 1, coated parallel twin wires 1 comprise two single wires 4-1 and 4-2 arranged in a parallel manner and joined together. The single wires 4-1 and 4-2 respectively have copper core wires 2-1 and 2-2 coated with insulating coating films 3-1 and 3-2 made of polyurethane or the like. Each of the core wires 2-1 and 2-2 has a diameter of approximately 60 $\mu$m, and each of the single wires 4-1 and 4-2 has a diameter of approximately 80 $\mu$m.

Figure 2:
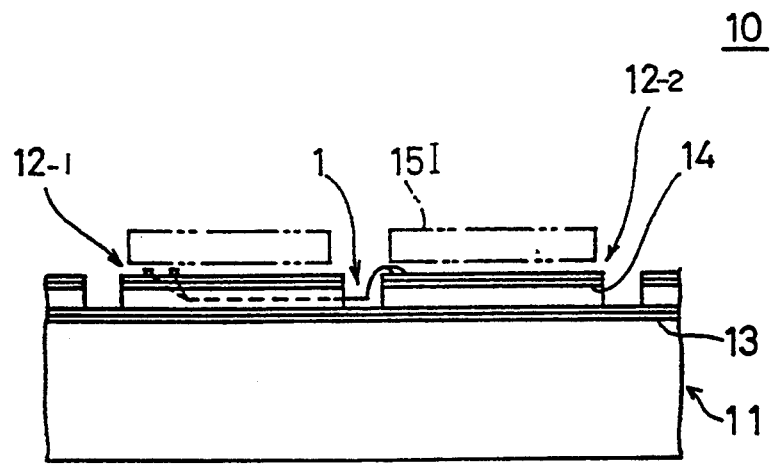
FIG. 2 is a side view of the structure of a printed circuit board.
Figure 3:
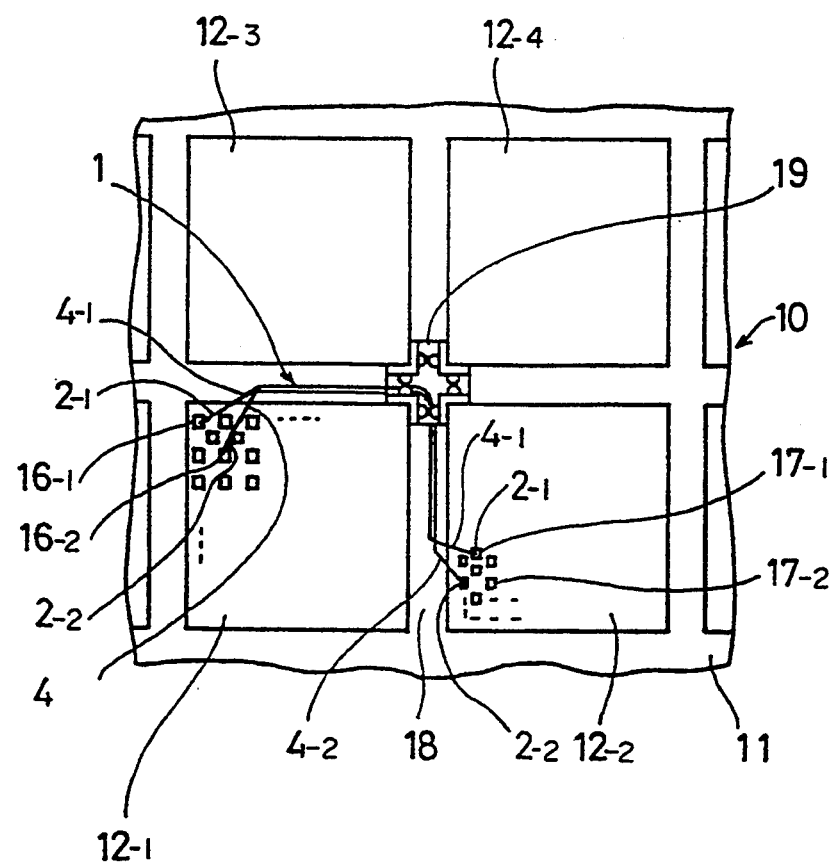
FIG. 3 is a plan view of an example of wiring.

FIGS. 2 and 3 show a printed circuit board on which the coated parallel twin wires 1 are provided. As shown in these figures, interposers 12-1–12-4 are arranged on an upper surface of a main body 11 of the printed circuit board so that a matrix of the interposers 12-1–12-4 is formed. Polyimide thin film that is as thin as 15 $\mu$m is formed in the vicinity of surfaces of the printed circuit board main body 11. Further, polyimide thin films 14 are formed in the vicinity of the surfaces of the interposers 12-1–12-4. A large number of pads arranged in rows and columns are formed on the surfaces of the interposers 12-1–12-4. IC chips 15 are mounted on the interposers 12-1–12-4 by utilizing pads arranged in the respective center areas of the interposers 12-1–12-4 after the wires are provided.

Figure 4:
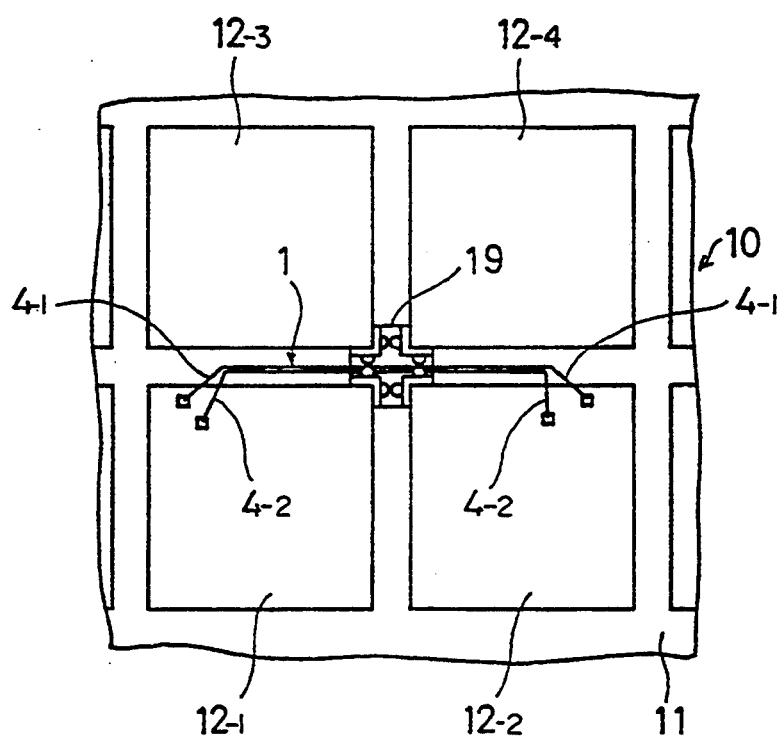
FIG. 4 is a plan view of another example of wiring.

The coated parallel twin wires 1 are connected in the following manner. One end of the core wire 2-1 is bonded to a signal pad 16-1 located in an outer area of the interposer 12-1, and one end of the core wire 2-2 is bonded to a ground pad 16-2 formed on the interposer 12-1. The other end of the core wire 2-1 is bonded to a signal pad 17-1 formed on the interposer 12-2, and the other end of the core wire 2-2 is bonded to a pad 17-2 formed thereon. Intermediate portions of the twin wires 1 are accommodated in grooves 18 formed between the adjacent interposers 12-1–12-4, and are guided by a routing guide 19 so that the twin wires are bent at a right angle. The single wires 2-1 and 2-2, which are respectively signal and ground lines, are provided with different colors. As shown in FIG. 4, the coated parallel twin wires 1 are arranged in a straight line.

WIRING APPARATUS 20 FOR COATED PARALLEL TWIN WIRES

A description will now be given, with reference to FIGS. 5 through 12, of a wiring apparatus 20 for connecting coated parallel twin wires. The wiring apparatus 20 has a frame 21 in which various mechanisms are provided and controlled by a main controller 22.

A stage 32 can be moved in two directions X and Y in the horizontal plane and can be rotated around a vertical axis Z. The printed circuit board 10 to which the twin wires 10 are provided is placed on the stage 32. A wire bonder 35 has a wedge 36 having a point portion in which a heater is built. The wire bonder 35 moves the wedge 36 upwards and downwards in the Z-axis direction for bonding, and moves it in the X direction for shunting. Wire cutting mechanisms 37 and 38 respectively having blades are provided on respective sides of the wedge 36. These blades can be moved upwards and downwards.

Now, a description will be given of structural elements in the order in which these structural elements are arranged in the direction along which the wires are transported.

A wire splitter 40 has a needle 42 used to form a slit for cutting on the twin wires 1 drawn from a bobbin 41. A wire feeder 45 draws the twin wires 1 from the bobbin 41 and delivers them. The twin wires 1 delivered by the wire feeder 45 are transported to a wire splitting mechanism 47 by means of a mini-feeder 46. A wire clamper 48 is provided to the mini-feeder 46. A tension applying mechanism 50, which is provided in front of the mini-feeder 46, has a roller-shaped weight which applies a predetermined tension to the twin wires 1. The mechanism 50 is provided with a linear encoder 52 for detecting the level (height) of the weight 51.

Figure 11A:
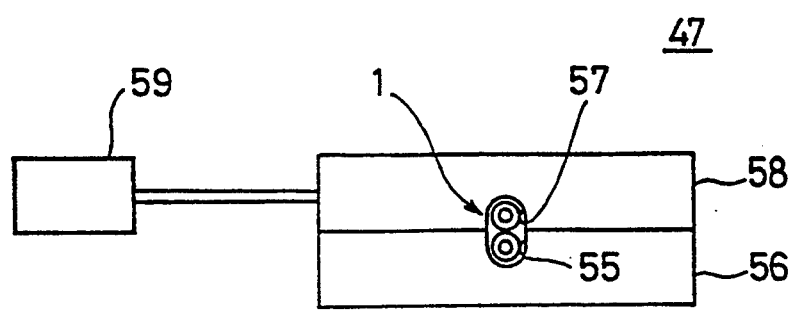
FIGS. 11A and 11B are diagrams of a wire splitting mechanism.
Figure 11B:
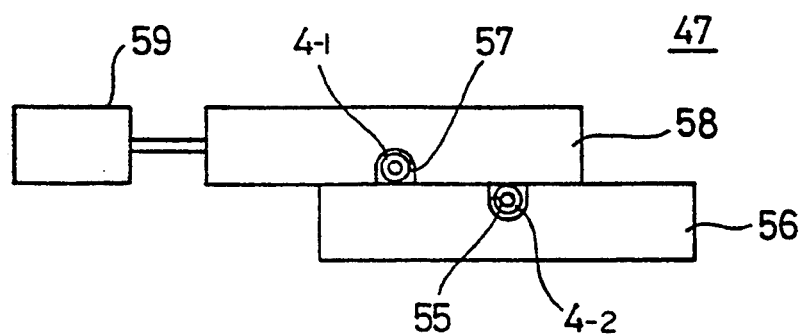

As shown in FIG. 11A, the wire splitting mechanism 47 comprises a lower block 56 and an upper block 58, which respectively have grooves 55 and 57 having a size corresponding to the single wire 4-1 or 4-2 and which are stacked so that the grooves 55 and 57 face each other. As shown in FIG. 11B, the upper block 58 can be moved by means of an air actuator 59.

Figure 12A:
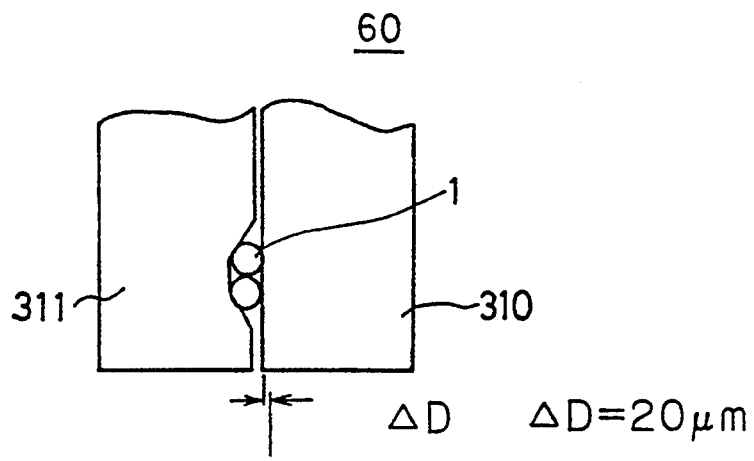
FIGS. 12A, 12B and 12C are diagrams of a hand for holding twin wires.
Figure 12B:
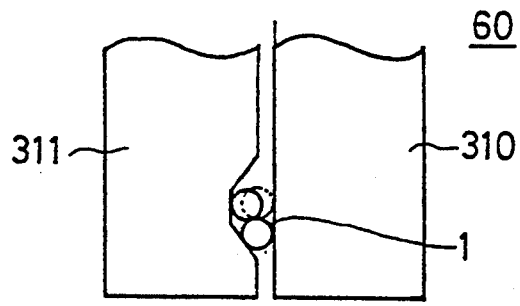
Figure 12C:
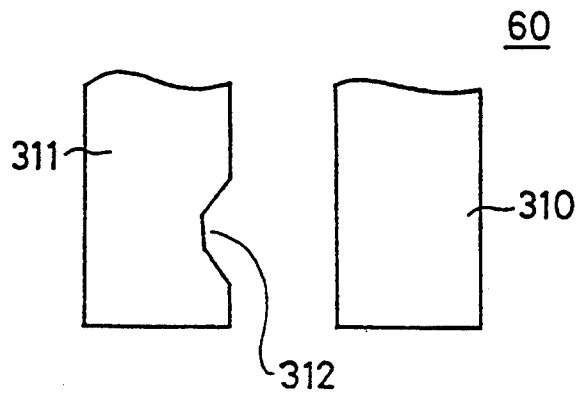

A hand 60 designed to handle the twin wire 1 is controlled by a controller 61 (shown in FIG. 6) so that it is maintained in a grasped state shown in FIG. 12A or in a loose state shown in FIG. 12B. A hand moving mechanism 62 having three motors is driven under the control of a controller 63 shown in FIG. 6, and for moving the hand 60 in the directions X, Y and Z. A first single-wire hand 65 can grasp the single wire 4-1 separated from the other single wire 4-2 by means of the wire splitting mechanism 47. A hand moving mechanism 66 having three motors (M) is driven under the control of a controller 67 shown in FIG. 6, and moves the hand 65 in the directions X, Y and Z. A second single-wire hand 70 can grasp the single wire 4-2 separated from the other single wire 4-1 by means of the wire splitting mechanism 47. A hand moving mechanism 71 having three motors is driven under the control of a controller 72 shown in FIG. 6, and moves the hand 70 in the directions X, Y and Z independently of the hand 65. The grasp forces of the hands 65 and 70 can be controlled by the controller 61.

A coating removing device 75 projects a laser beam onto the single wires 4-1 and 4-2 in response to an instruction output from the main controller 22, and removes coating portions having a predetermined length from the coating of the wires 4-1 and 4-2. A visual recognition device 80 includes a microscope, and provides a view indicating a positional relationship between exposed parts of the wires from which the coatings are removed and parts to which the wires are to be bonded.

Figure 5:
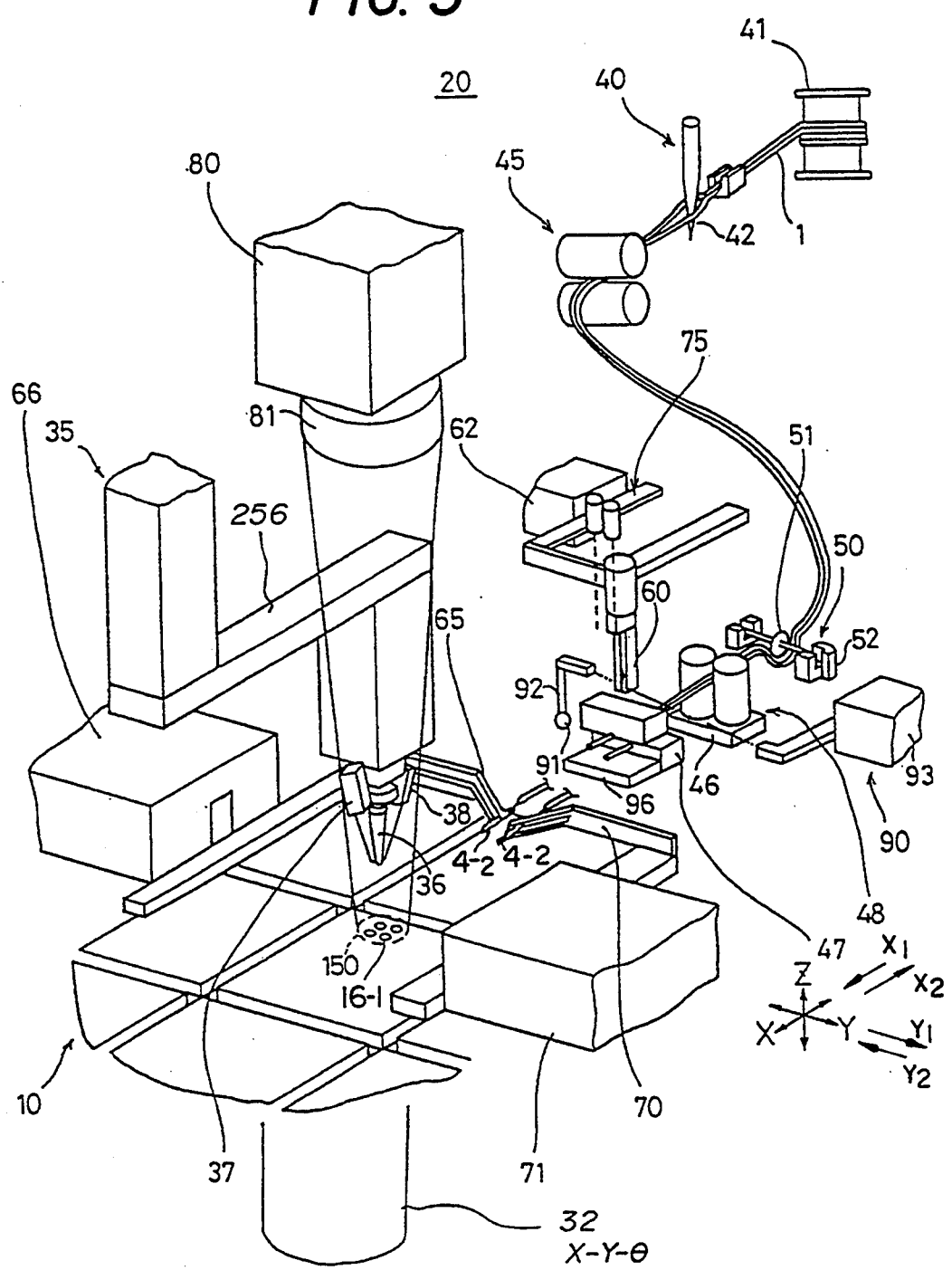
FIG. 5 is a perspective view of a wiring apparatus according to an embodiment of the present invention.
Figure 6:
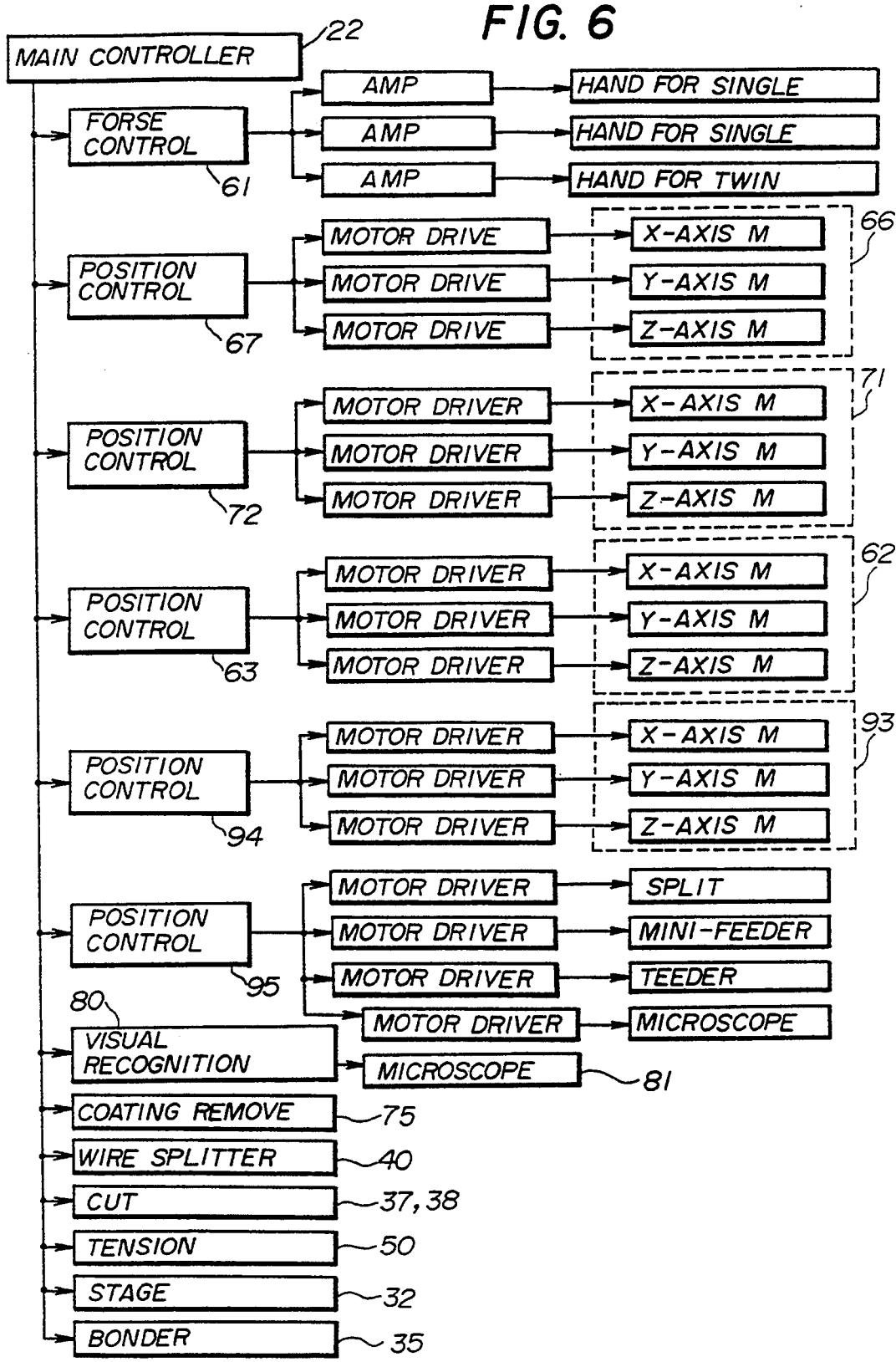
FIG. 6 is a block diagram of a system structure of the wiring apparatus shown in FIG. 5.
Figure 7:
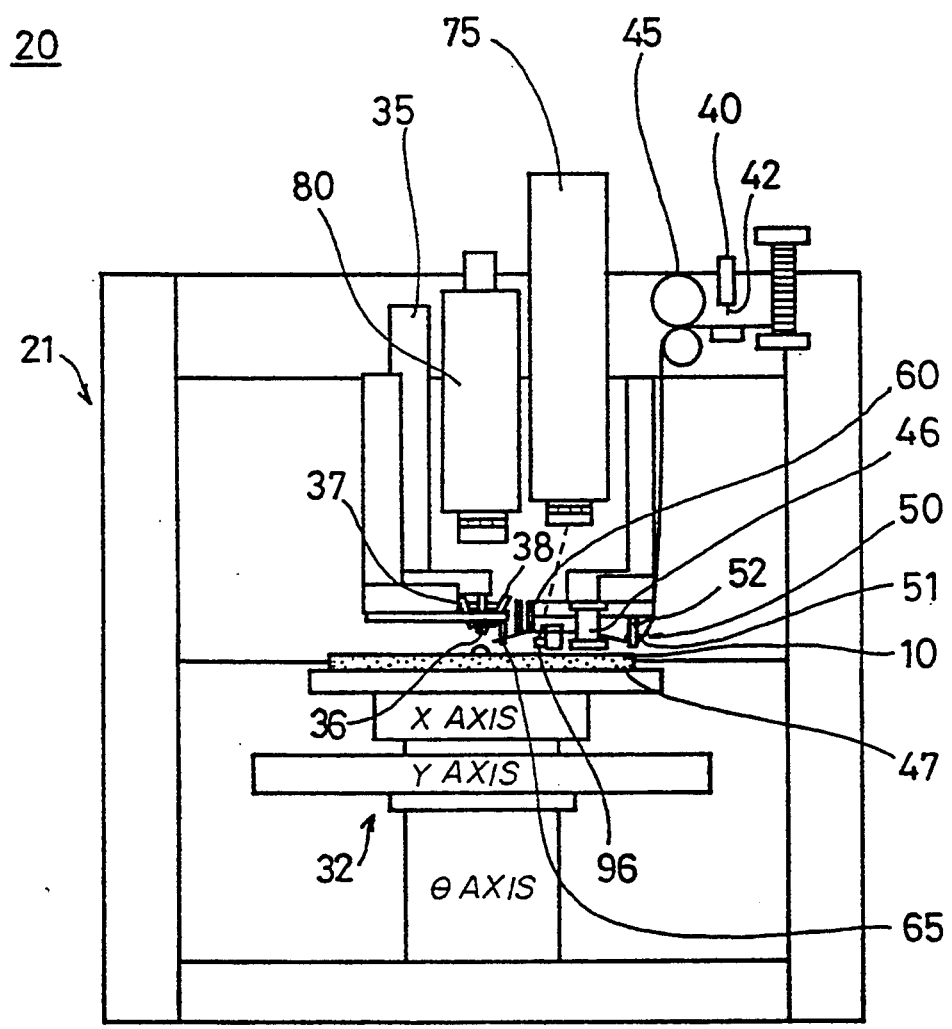
FIG. 7 is a front view of the wiring apparatus shown in FIG. 5.
Figure 8:
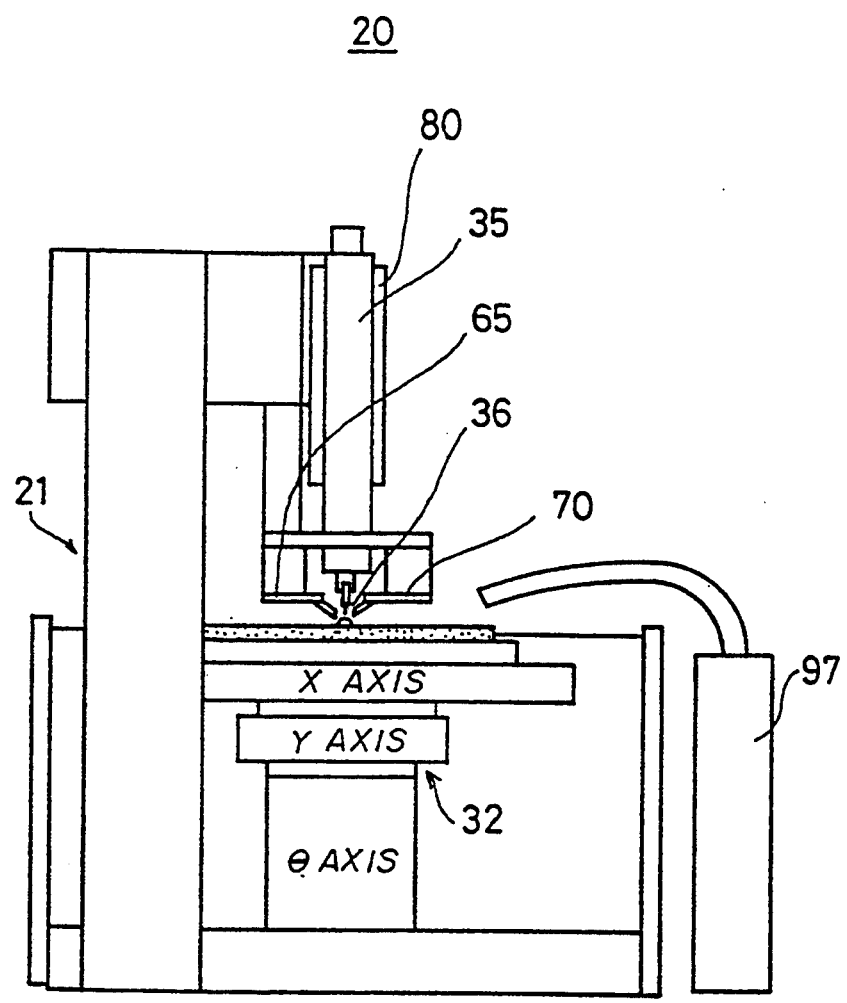
FIG. 8 is a side view of the wiring apparatus shown in FIG. 5.
Figure 9:
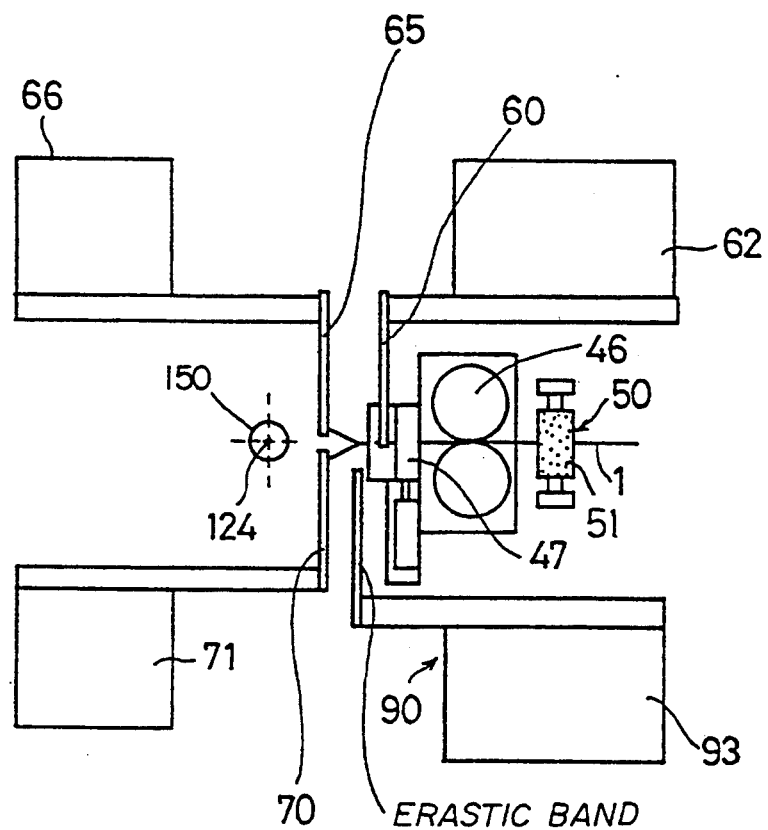
FIG. 9 is an enlarged plan view of a center part of the wiring apparatus shown in FIG. 5.

A wire push-in mechanism 90 comprises a rod-shaped hand 92 having a rubber ball 91 at a lower end thereof, and a hand moving mechanism 93 having three motors. The hand moving mechanism 93 is driven under the control of a controller 94 shown in FIG. 6, and moves the hand 92 in the directions X, Y and Z. A groove 91a is formed in a lower portion of the rubber ball 91. A controller 95 shown in FIG. 6 controls the wire feeder 45, the mini-feeder 46, the wire splitting mechanism 47 and the microscope 81. A work bench 96 is provided as shown in FIG. 5. A sucker 97 shown in FIG. 8 sucks the remaining wires.

WIRING METHOD AND AN EMBODIMENT OF THE INVENTION

A description will now be given of a wiring operation of the wiring apparatus 20 having the above-mentioned structure.

Figure 13:
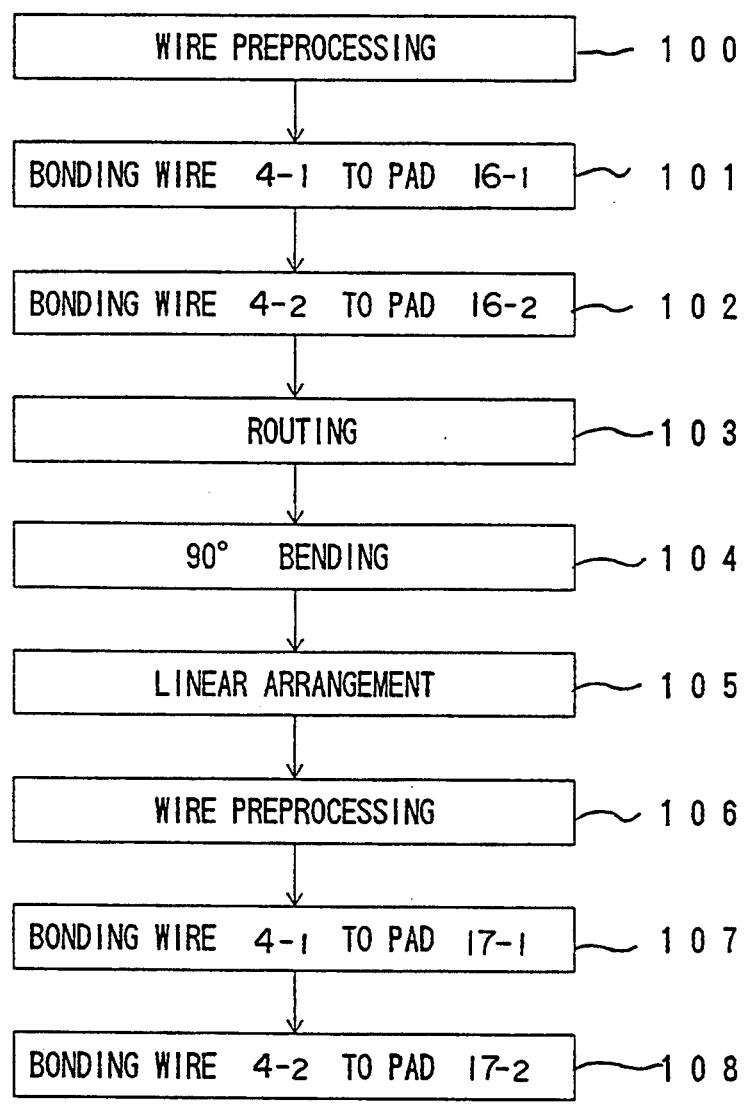
FIG. 13 is a flowchart of a wiring operation of the wiring apparatus shown in FIG. 5.

The wiring operation is controlled by the main controller 22 and is automatically carried out in accordance with steps shown in FIG. 13.

[1] Preprocessing Step 100

(1) The wire splitter 40 is operated, and sticks the needle 43 in the center of the twin wires 1.

(2) The wire feeder 45 is operated, and the twin wires 1 are stretched to a predetermined length, so that a predetermined length of the twin wires 1 is torn off.

(3) The hand 60 grasps the twin wires 1 and draws these wires 1. Then, the hand 60 places the torn portions of the twin wires 1 in the wire splitting mechanism 47 (see FIG. 14A and FIG. 11A).

(4) The wire splitting mechanism 47 is operated, so that the single wires 4-1 and 4-2 are separated from each other (see FIG. 14B and FIG. 11B).

(5) The hand 65 grasps the single wire 4-1, and the hand 70 grasps the single wire 4-2 (see FIG. 14C).

(6) The hands 65 and 70 draw the single wires 4-1 and 4-2. The hand 65 places the single wire 4-1 in a trimming position (see FIG. 14D). At this time, the wire clamper 48 is maintained in a clamping releasing state, and tension equal to 10 gr is applied to the single wires 4-1 and 4-2 by means of the tension applying mechanism 50. Hence, the single wire 4-1 is precisely placed in the trimming position.

(7) The coating removing device 75 is operated and the coating of the single wire 4-1 is partially removed. A reference number 120 shown in FIG. 14E indicates a part from which the coating of the single wire 4-1 has been removed, so that the core wire of the single wire 4-1 is exposed. A reference 121 shown in FIG. 14E indicates the starting end of the core wire of the single wire 4-1.

(8) The hand 70 positions the single wire 4-2 in a trimming position (see FIG. 14F).

(9) The mechanism 75 is operated and the coating of the single wire 4-2 is removed as indicated by reference number 121 (see FIG. 14G). A reference number 123 shown in FIG. 14G indicates the starting end of the core wire of the single wire 4-2.

[2] Step 101 for Bonding Single Wire 4-1 to Signal Pad 16-1

(1) The stage 32 is operated and hence the printed circuit board 10 is moved, so that the signal pad 16-1 among the pads on the interposer 12-1 is positioned at the position of the wedge 36, that is, a bonding point 124 (see FIG. 15A). A reference number 150 indicates a field of view.

(2) The hand 65 is moved, and the exposed portion 120 of the single wire 4-1 is positioned in the bonding point 124 (see FIG. 15B). At this time, the wire clamper 48 is maintained in the clamping releasing state, and a tension generated by the mechanism 50 is exerted on the wire 4-1. Hence, the wire 4-1 is in the stretched state, and the positioning is precisely performed.

(3) The positional relationship between the pad 16-1 and the exposed portion 120 is checked by means of the microscope 81, and the relative position is adjusted, as necessary.

(4) The wire bonder 35 is operated and presses the starting end 121 of the wire core on the pad 16-1 by means of the wedge 36. Thereafter, the wedge 36 is heated and then cooled. In this manner, the starting end of the wire core is bonded to the pad 16-1. Since the coating is removed beforehand, the force of pressing by the wedge 36 is much less than that in the conventional case, and is 30 gr or less. Hence, it becomes possible to substantially prevent the thin films 14 (see FIG. 2) from being damaged and to perform the bonding without damaging the thin films 14.

(5) The wire cutting mechanism 37 is operated, and forms a slit for cutting in a portion of the single wire 4-1 on the side of the hand 65 from the bonded portion.

(6) The hand 65 stretches the wire 4-1, so that the remaining part of the wire 4-1 is cut off (see FIG. 15C).

[3] Step 102 for Bonding the Single Wire 4-2 to Ground Pad 16-2

(1) The hand 70 is moved, and the exposed portion 122 of the single wire 4-2 is positioned in the bonding point 124 (see FIG. 16A).

(2) The stage 32 is moved and the ground pad 16-2 is positioned in the bonding point 124 (see FIG. 16B). The ground pad 16-2 shown in FIG. 16A is adjacent to the signal pad 16-1. However, an arbitrary ground pad can be used. If the twin wires 1 are greatly bent in step (1), steps (1) and (2) are alternately and repeatedly carried out. Thereafter, the same processes as those in step 101 are carried out.

(3) The bonding position is checked by the microscope 81.

(4) The starting end 123 of the core wire is bonded to the pad 16-2.

(5) The wire cutting mechanism forms a slit for cutting on the single wire 4-2.

(6) The hand 70 cuts off the remaining part of the wire 4-2 (see FIG. 16C).

[4] Routing Step 103

(1) As shown in FIG. 12B, the hand 60 grasps the twin wires 1 in the loose state.

(2) The stage 32 is operated and hence the printed circuit board 10 is moved, so that the twin wires 1 are drawn to cause the leading portions thereof to face the pads 16-1 and 16-2.

[5] Step 104 for Bending Wirings at a Right Angle (1) As shown in FIGS. 17A and 17B, the hand 92 is positioned immediately before the routing guide 19, and the hand 60 is positioned in a position close to the routing guide.

Figure 18A:
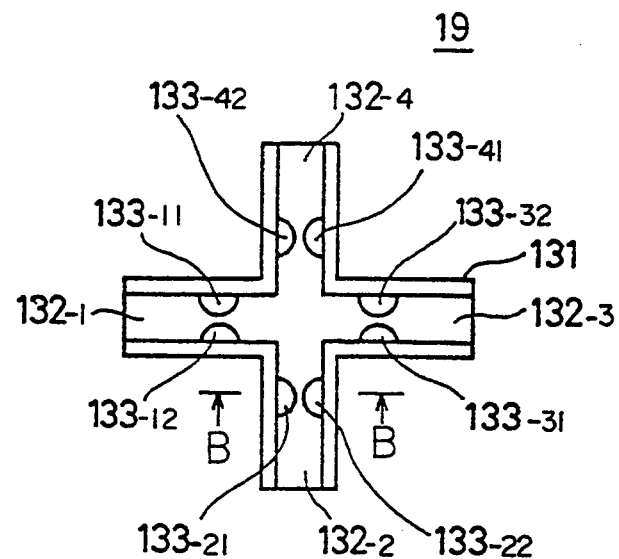
FIGS. 18A and 18B are diagrams of a routing guide.
Figure 18B:
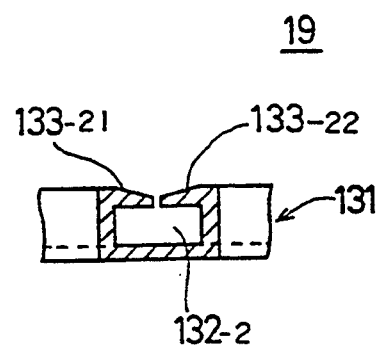

(2) The hand 92 is moved downwards and pushed in the groove 132-1 in a state in which the rubber ball 91 holds the wires 1 in the groove 91a. In this manner, the wires 1 are moved down. As shown in FIGS. 18A and 18B, the routing guide 19 has four pairs of tongue pieces (133-11, 133-12), (133-21–133-22), (133-31, 133-32) and (133-41, 133-42) respectively provided in the four grooves 132-1–132-4 of the guide main body 133 crossed. Each of the tongue pieces has a tapered upper surface which is a downward slope towards the end thereof. The wires 1 become as indicated by a broken line shown in FIG. 17B. Since the hand 60 is positioned in the vicinity of the routing guide 19, the slant angle $\alpha_1$ of the wires 1 is great. Hence, the wires 1 do not enter the groove 132-13, and spread the tongue pieces 133-11 and 133-12. Hence, the wires 1 enter into only the groove 132-1.

(3) The hand 92 is slightly shifted laterally. This is because the wires 1 are kept engaged with the tongue piece 133-11 or 133-12 and are prevented from getting away from the groove 132-1. Thereafter, the hand 92 is moved upwards.

(4) The stage 32 is rotated and hence the printed circuit board 10 is rotated by 90°. Hence, the wires 1 are relatively bent at a right angle.

(5) The hand 92 is positioned just above the routing guide 19 (see FIG. 17C and FIG. 17D).

(6) The hand 92 is moved downwards, and the wires 1 are pushed in the routing guide 19 by means of the rubber ball 91. Hence, the wires 1 become as indicated by a two-dot chained line shown in FIG. 17D, and spread the tongue pieces 133-21 and 133-22. Hence, the wires 1 enter into the groove 132-2.

(7) The hand 92 is slightly moved laterally, and hence the wires are slightly moved laterally. Thereafter, the hand 92 is moved upwards. If the wires 1 get away from the routing guide 19 when the hand is moved upwards, the height position of the roller-shaped weight 51 is abruptly changed. The linear encoder 52 detects the above abrupt change. In this manner, it is possible to detect whether or not the wires 1 get away from the routing guide 19. When it is determined by the linear encoder 52 that the wires 1 have gotten away from the routing guide 19, the above operation is performed again.

[6] Straight Wiring Step 105

(1) As shown in FIGS. 19A and 19B, the hand 92 is positioned immediately before the routing guide 19, and the hand 60 is positioned at a position further from the routing guide 19 than the position shown in FIG. 17B.

(2) The hand 90 is moved downwards, so that the rubber ball 91 is pushed in the groove 132-1 and the wires 1 are depressed. The wires 1 are as indicated by a broken line in FIG. 19B. More particularly, the slant angle $\alpha_2$ becomes less than the aforementioned slant angle $\alpha_1$. The wires 1 stretch the tongue pieces 133-11 and 133-12 and enter into the groove 132-1. Simultaneously, the wires 1 stretch the tongue pieces 133-31 and 133-32 and enter into the groove 132-3.

(3) The hand 92 is slightly moved laterally, and is then moved upwards. The steps 104 and 105 are carried out in accordance with wiring routes.

[7] Wire Preprocessing Step 106

The same step as the aforementioned preprocessing step 100 is carried out. FIG. 20A shows a state in which the preprocessing step 106 is completed, the single wire 4-1 is grasped by the hand 65, and the single wire 4-2 is grasped by the hand 70. A reference number 140 indicates a portion of the single wire 4-1 from which the coating has been removed. A reference number 141 indicates an end of the core wire of the single wire 4-1. A reference number 142 indicates a portion of the signal wire 4-2 from which the coating has been removed. A reference number 143 indicates an end of the core wire of the single wire 4-2.

[8] Step 107 for Bonding Single Wire 4-1 to Signal Pad 17-1

(1) The stage 32 is moved and hence the printed circuit board 10 is moved so that the signal pad 17-1 among the pads formed on the interposer 12-2 is positioned at bonding point 124 (see FIG. 20A).

(2) The hand 65 is moved and the exposed position 140 of the single wire 4-1 from which the coating has been removed is positioned in the bonding point 124 (see FIG. 20B). At this time, the single wire 4-1 is provided with tension and is stretched, so that the above positioning can be precisely performed.

(3) The positional relationship between the pad 17-1 and the portion 140 is checked by means of the telescope 81, and is adjusted as necessary.

(4) The wire bonder 35 is operated, and the end 141 of the core wire is bonded to the pad 17-1.

(5) The wire cutting mechanism 38 is operated, and a slit for cutting is formed in a portion of the single wire 4-1 on the side of the bobbin 41 from the bonded portion.

(6) The hand 65 is released (see FIG. 20C).

[9] Step 108 for Bonding Single Wire 4-2 to Ground Pad 17-2

Figure 21A:
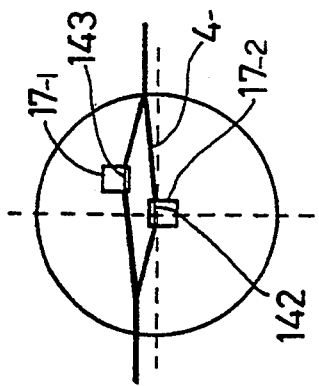
FIGS. 21A, 21B, 21C and 21D are diagrams of a step for bonding the wire 4-2 to the pad 17-2.

(1) The hand 70 is moved and the portion 142 of the single wire 4-2 from which the coating has been removed is positioned in the bonding point 124 (see FIG. 21A).

Figure 21B:
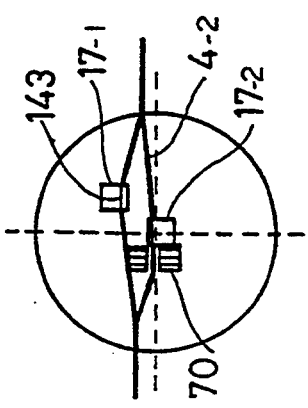

(2) The stage 32 is moved so that the ground pad 17-2 is positioned in the bonding point 124 (see FIG. 21B). If the wife 4-2 is greatly bent in step (1), the above steps (1) and (2) are alternately and repeatedly carried out.

(3) The bonding position is checked by the microscope 81.

(4) The end of the core wire 141 is bonded to the pad 17-2 by the wife bonder 35 (see FIG. 21B).

Figure 21D:
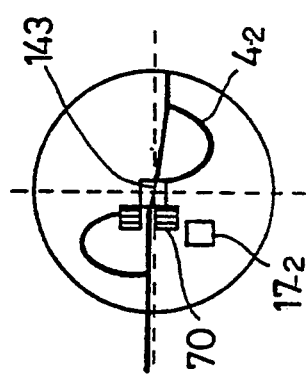
Figure 21C:
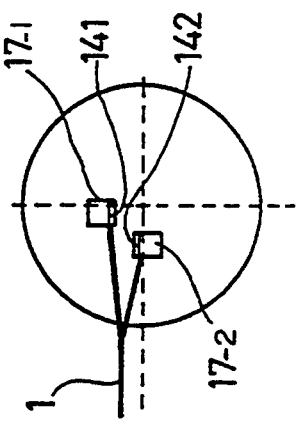

(5) The wire cutting mechanism 38 forms a slit for cutting in the wires 1 (see FIG. 21C).

(6) The mini-feeder 46 clamps the wires 1. Then, the stage 32 is moved and the printed circuit board 10 is moved to cut the wires (see FIG. 21D).

In the above-mentioned manner, the process for connecting the twin wipes 1 to the bonding pads is completed, as shown in FIGS. 3 and 4. Then, the wiring process fop the next twin wipes 1 is carried out. In the above-mentioned wiping process, bonding to pads is carried out so that wipes from which coatings are removed beforehand are serially bonded one by one. Hence, as compared with the conventional process in which the coatings of two wipes are melted and simultaneously bonded, the degree of pressure applied to the wires can be reduced. Hence, the wire bonding to the pads 16-1, 16-2, 17-1 and 17-2 can be safely performed without damaging the thin films 14 of the interposers 12-1 and 12-2.

VARIATIONS OF WIRE SEPARATING MECHANISM 47

A description will now be given of variations of the wife splitting mechanism 47 shown in FIG. 5.

(1) First Variation

Figure 22:
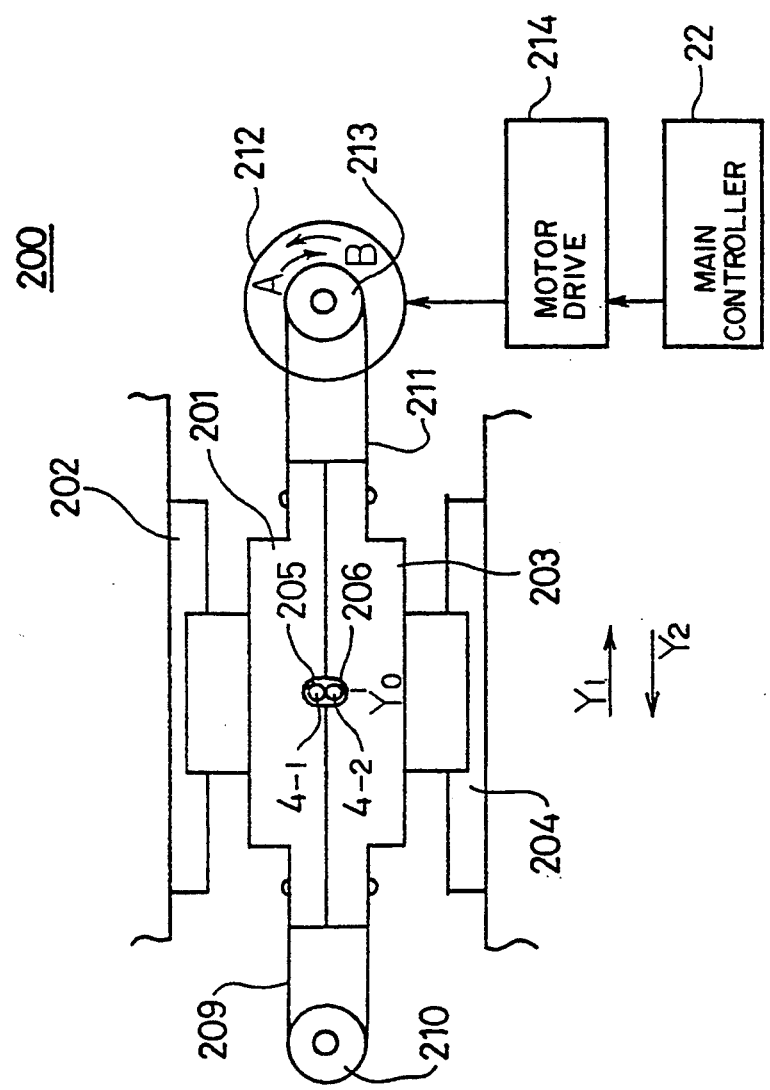
FIG. 22 is a diagram of a first variation of the wire splitting mechanism.
Figure 23A:
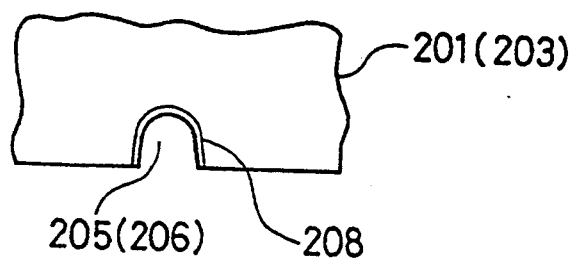
FIGS. 23A and 23B are enlarged diagrams of a groove shown in FIG. 22.
Figure 23B:
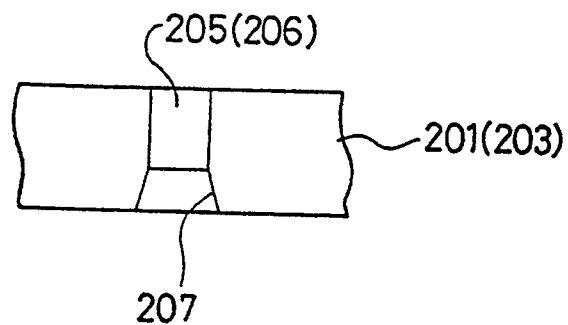

FIG. 22 shows a wife splitting mechanism 200 according to a first variation of the wire splitting mechanism 47. An upper block 201 is supported by a linear guide 202. A lower block 203 is supported by a linear guide 204. Grooves 205 and 206 having a size corresponding to the single wife are formed in the blocks 201 and 203. As shown in the plan and bottom views of FIGS. 23A and 23B, the groove 205 has a taper portion 207, and a film 208 made of Teflon (trademark). The taper portion 207 makes it possible for the twin wires 1 to smoothly enter into the grooves 205 and 206. The film 208 of Teflon makes it possible for the twin wires 1 to be smoothly inserted into a hole formed by the grooves 205 and 206. The groove 206 has the same shape and structure as the groove 205.

In FIG. 22, respective ends of a steel belt 209 are connected to ends of the blocks 201 and 203. The belt 209 is rolled on a pulley 210. Respective ends of a steel belt 211 are connected to the other ends of the blocks 201 and 203. The belt 211 is rolled a pulley 213. A motor driving circuit 214 is activated in response to an instruction from the main controller 22, and a motor 212 is rotated by a predetermined angle in a direction indicated by an arrow A or B. Normally, the grooves 205 and 206 face each other. When the motor 212 is rotated, the blocks 201 and 203 are respectively displaced by a predetermined distance in directions Y1 and Y2 opposite to each other.

The above-mentioned wire splitting mechanism 200 is provided at an end part of the wire transporting path, as shown in FIG. 24. In FIG. 24, parts that are substantially the same as parts shown in FIG. 5 are given the same reference numbers, and a description thereof will be omitted. The wire splitter 40 is composed of a needle 215 and a solenoid 216 for pushing out the needle 215. A coating removing device 217 is provided at a position closer to the bobbin 41 than the splitter 40. A tube 218 for guiding the twin wires delivered from the mini-feeder 46 is provided between the mini-feeder 46 and the wire splitting mechanism 200.

Figure 25A:
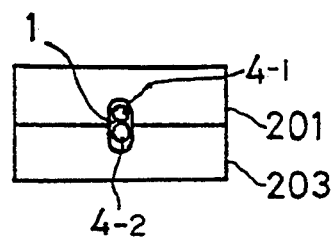
FIGS. 25A, 25B, 25C, 25D, 25E, 25F, 25G, 25H and 25F are diagrams for explaining a wire splitting process.
Figure 25B:
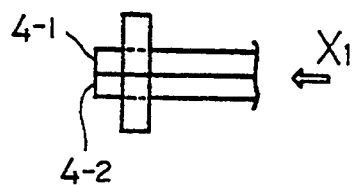
Figure 25C:
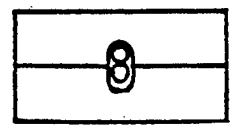
Figure 25D:
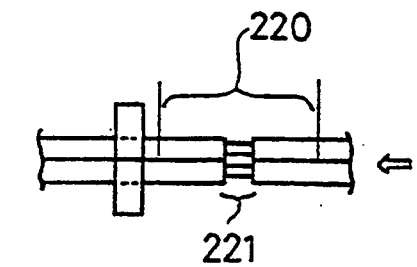

A description will now be given of a wire splitting operation of the wire splitting mechanism 200. The coating removing device 217 shown in FIG. 24 removes the coatings of the twin wires 1 and tears the twin wires 1 by means of the wire splitter 40. As shown in FIG. 25D, a torn portion 220 is formed in a part including a part from which the coatings are removed from the twin wires 1. As shown in FIGS. 25A, 25B, 25C and 25D, the twin wires 1 are delivered in a direction X1, and are inserted into the hole formed by the grooves 205 and 206. The single wire 4-1 of the twin wires 1 which is a signal line is inserted into the upper groove 205, and the single wire 4-2 which is a ground line is inserted into the lower groove 206. The above arrangement of the single wires is set so that an operator is able to see the colors of the twin wires 1.

Figure 25E:
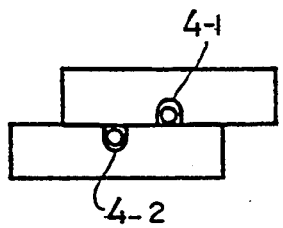
Figure 25F:
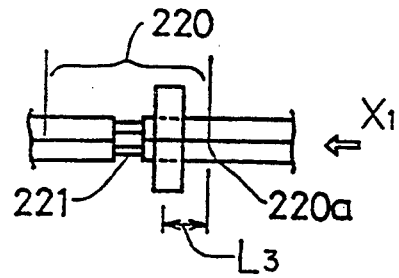

As shown in FIG. 25F, when the portion 221 from which the coating passes over the grooves 205 and 206, the motor 212 shown in FIG. 22 is moved by the predetermined angle.

It will now be assumed that pads to which the wires are bonded are arranged so that the ground pad 17-1 is located on the left side and the signal pad 16-1 is located on the right side. According to information indicating the above arrangement of the pads, the motor 212 is rotated in the direction indicated by the arrow A. Hence, the upper block 201 is moved in the Y1 direction, and the lower block 203 is moved in the Y2 direction by the same distance as the upper block 201.

Figure 26:
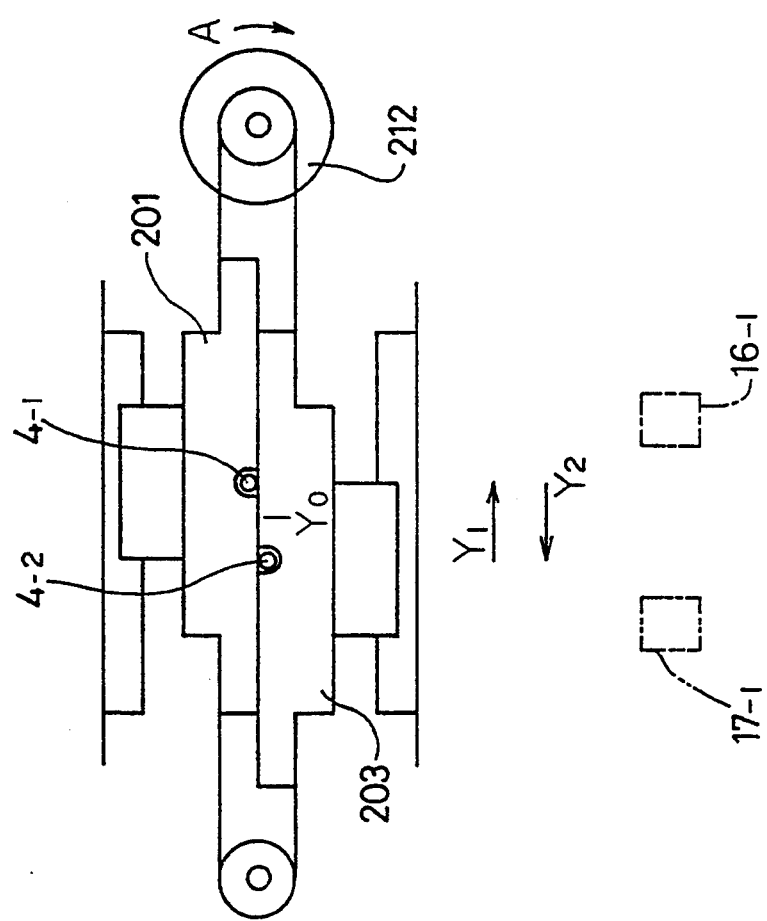
FIG. 26 is a diagram of the state shown in FIG. 25E (ground-signal split state)

Hence, as shown in FIGS. 26 and 25E, the ground wire 4-2 is made to deviate from the original position Yo in the Y2 direction, and the single wire 4-1 is made to deviate therefrom in the Y1 direction by the same distance as the ground wire 4-2. Hence, the wires 4-1 and 4-2 are arranged from each other and substantially spaced apart from each other in the Y1 direction perpendicular to the X1 direction.

Figure 25G:
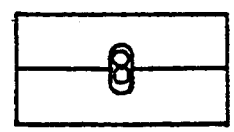
Figure 25H:
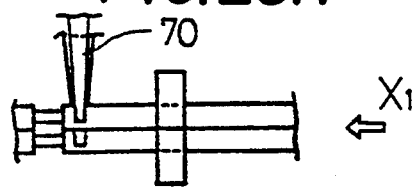
Figure 25I:
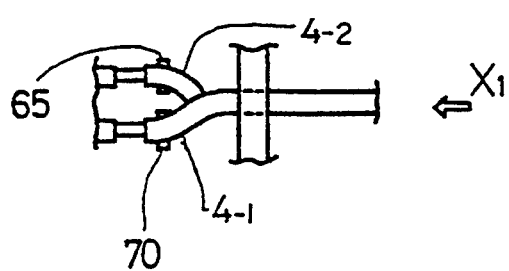

As shown in FIG. 25I, the first hand 65 grasps the ground wire 4-2, and the second hand 70 grasps the signal wire 4-1. In this state, the motor 212 is driven, and the wire splitting mechanism 200 is changed so that the grooves 205 and 206 face each other, as shown in FIGS. 25G, 25H and 25I. In this state, the twin wires 1 are further delivered, and subsequently the ground wire 4-2 is bonded to the pad 17-1 and the signal wire 4-1 is bonded to the pad 16-1 in the same manner has been described previously.

Figure 27:
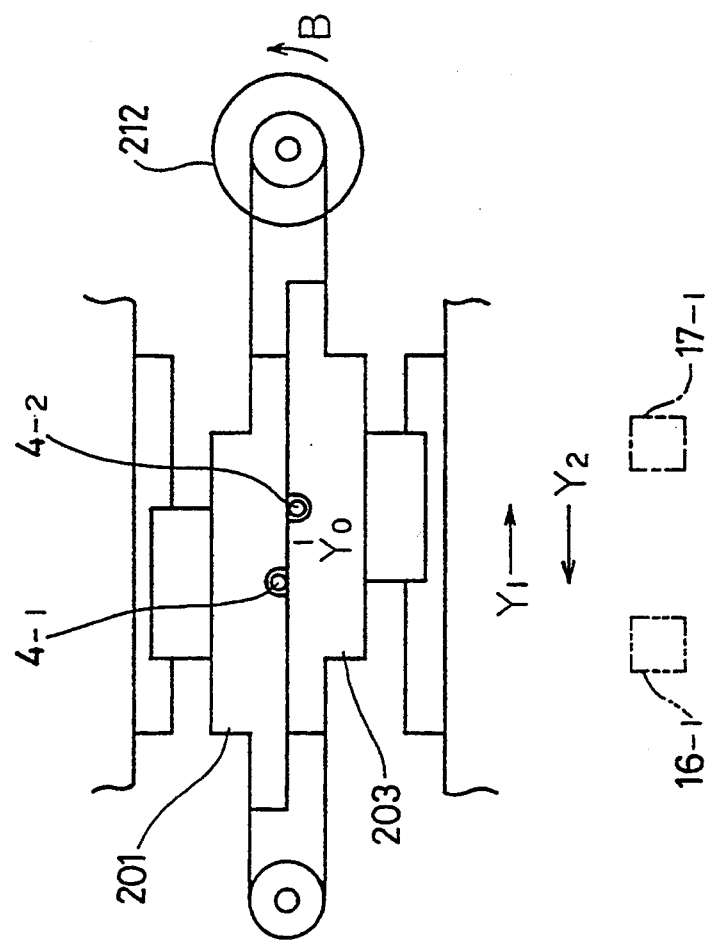
FIG. 27 is a diagram of the signal-ground split state.

Referring to FIG. 27, it will now be assumed that the signal pad 16-1 is located on the left side, and the ground pad 17-1 is located in the right side. In this case, the motor 212 is rotated in the direction indicated by the arrow B according to information indicating the above arrangement of the pads 16-1 and 17-1. Hence, the upper block 201 is moved in the Y2 direction, and the lower block 203 is moved in the Y1 direction by the same distance as the upper block 201. Hence, as shown in FIG. 27, the signal wire 4-1 is made to deviate from the original position Yo in the Y2 direction, and the ground wire 4-2 is made to deviate therefrom in the Y1 direction by the same distance as the signal wire 4-1. Hence, the wires 4-1 and 4-2 are arranged from each other and substantially spaced apart from each other in the Y1 direction. Thereafter, the first hand 65 grasps the signal wire 4-1, and the second hand 70 grasps the ground wire 4-2. Then, the signal wire 4-1 is bonded to the pad 16-1, and the ground wire 4-2 is bonded to the pad 4-2.

(2) Second Variation

Figure 28A:
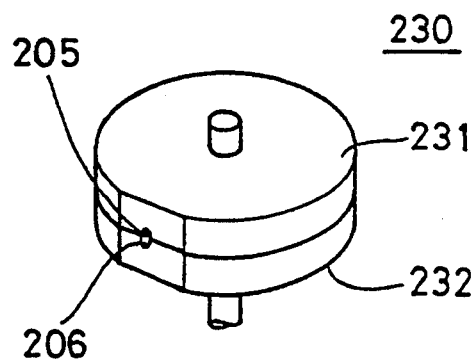
FIGS. 28A, 28B and 28C are diagrams of a second variation of the wire splitting mechanism.
Figure 28B:
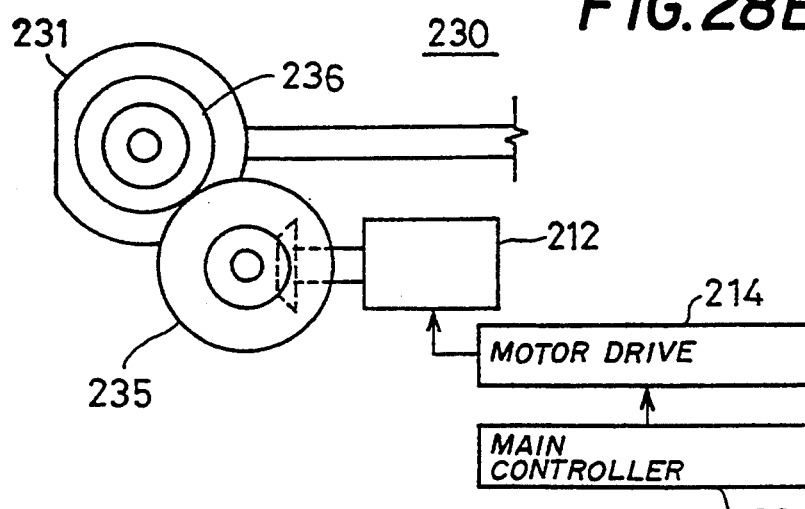
Figure 28C:
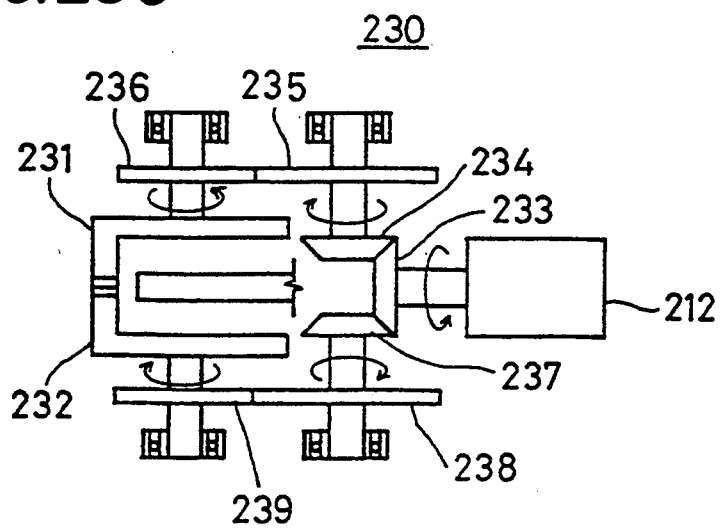

FIGS. 28A, 28B and 28C show a wire splitting mechanism 230 according to a second variation. A disk-shaped upper block 231 has a groove 205, and a disk-shaped lower block 232 is 206. The blocks 231 and 232 are concentrically arranged. A bevel gear 233 is rotated by the motor 212. Rotation of the bevel gear 233 is transferred to a bevel gear 234, and gears 235 and 236, and to a bevel gear 237, and gears 238 and 239. Hence, the upper block 231 and the lower block 232 are rotated in the different directions by the same angle as each other. Hence, the positions of the grooves 205 and 206 deviate from the original position thereof, and the signal wire and the ground wire are separated from each other in the same manner as has been described previously.

WIRE SPLITTING MECHANISM OPERATION TIMING SETTING MECHANISM

A description will now be given, with reference to FIG. 29, of an operation timing setting mechanism for setting operation timing of the wire splitting mechanism.

Figure 29:
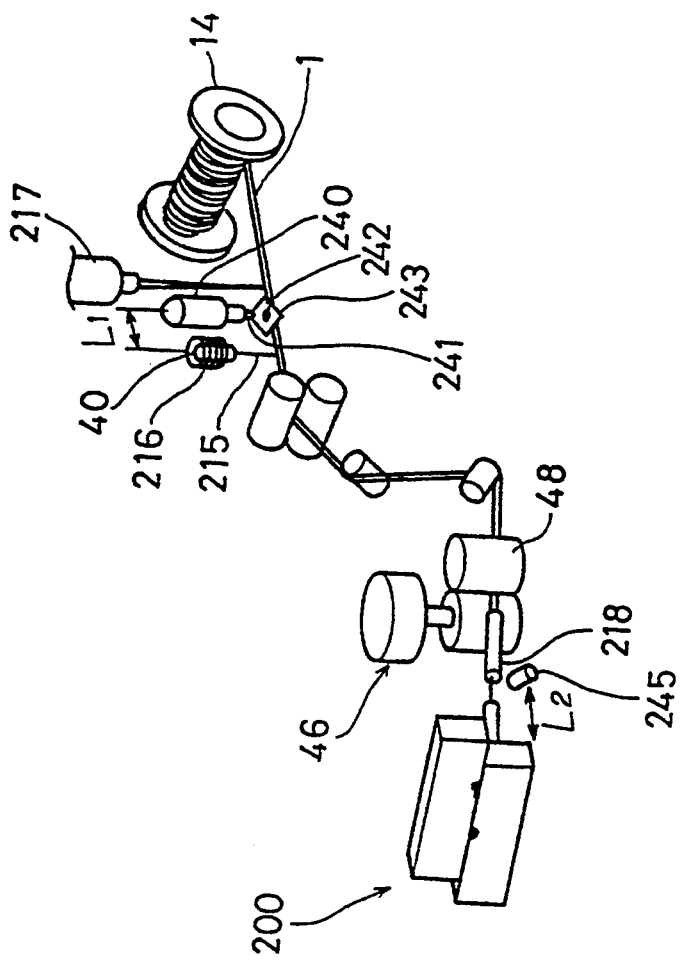
FIG. 29 is a wire splitting mechanism operation timing setting mechanism.
Figure 30:
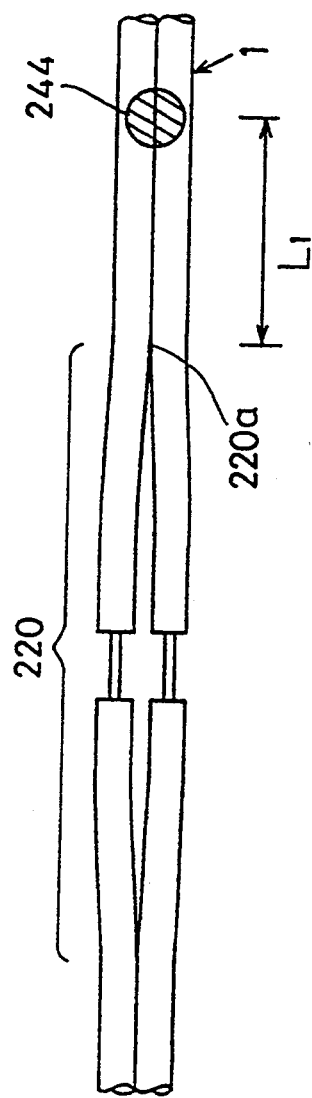
FIG. 30 is a diagram illustrating a state in which a mark is printed on a twin wire.

Referring to FIG. 29, a mark pressing device 240 is located on the upstream side of the wire splitter 40 in the wire transporting direction so that the device 240 is at a distance L1 from the wire splitter 40. The mark pressing device 240 presses, due to the function of a solenoid (not shown), a felt 241 on a mask 243 having a hole 242 defining the size of a mark, and further presses the felt 241 together with the mask 243 on the twin wires 1. The felt 241 is impregnated with quick drying oil-based ink. The mark pressing device 240 is driven at the same timing as the needle 215 is lifted. Hence, as shown in FIG. 30, a mark 244 is printed at the distance L1 from the end 220a of the portion 220 at which the twin wires 1 are torn. The reflectance of the mark 244 is different from that of the surface of the twin wires 1.

Figure 31A:
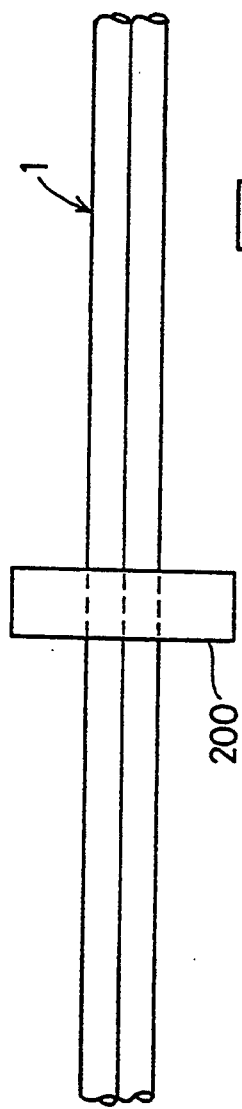
FIGS. 31A and 31B are diagrams illustrating a splitting operation on the twin wire.

As shown in FIGS. 29 and 31A, a mark detector 245, which is a reflected-light-detection type detector, is disposed in a position a distance L2 from the wire splitting mechanism 200 on the side of the mini-feeder 46.

As shown in FIG. 25F, it will now be assumed that the distance between the end 220a of the torn portion 220 and the wire splitting mechanism 200 is equal to L3 when the mechanism 200 is operated. The above distance L2 is set equal to L1+L3. A portion of the tube 218 opposite to the detector 245 has been removed.

Figure 31B:
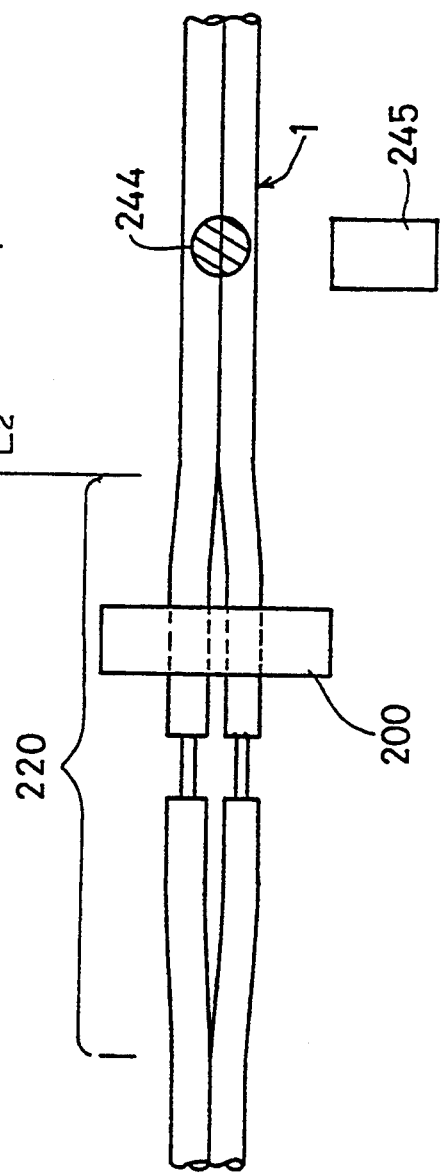

FIG. 31A shows a state in which the twin wires 1 from which the coatings have not been removed are transported. As shown in FIG. 31B, the torn portion 220 enters into the wire splitting mechanism 200, and the mark 244 faces the detector 245. At this time, the detector 245 detects the mark 244. A signal from the detector 245 is input to the controller 95 shown in FIG. 6, and hence the wire splitting mechanism 200 is operated by the controller 95. Then, the twin wires 1 are split into the single wires 4-1 and 4-2. Hence, the twin wires 1 are not affected by slippage at the feeder at all, and are split in the optimal position, so that the length L3 is constant.

WIRE CUTTING MECHANISMS 37 AND 38

A description will now be given of the wire cutting mechanisms 37 and 38 of the wire bonder 35.

Figure 32:
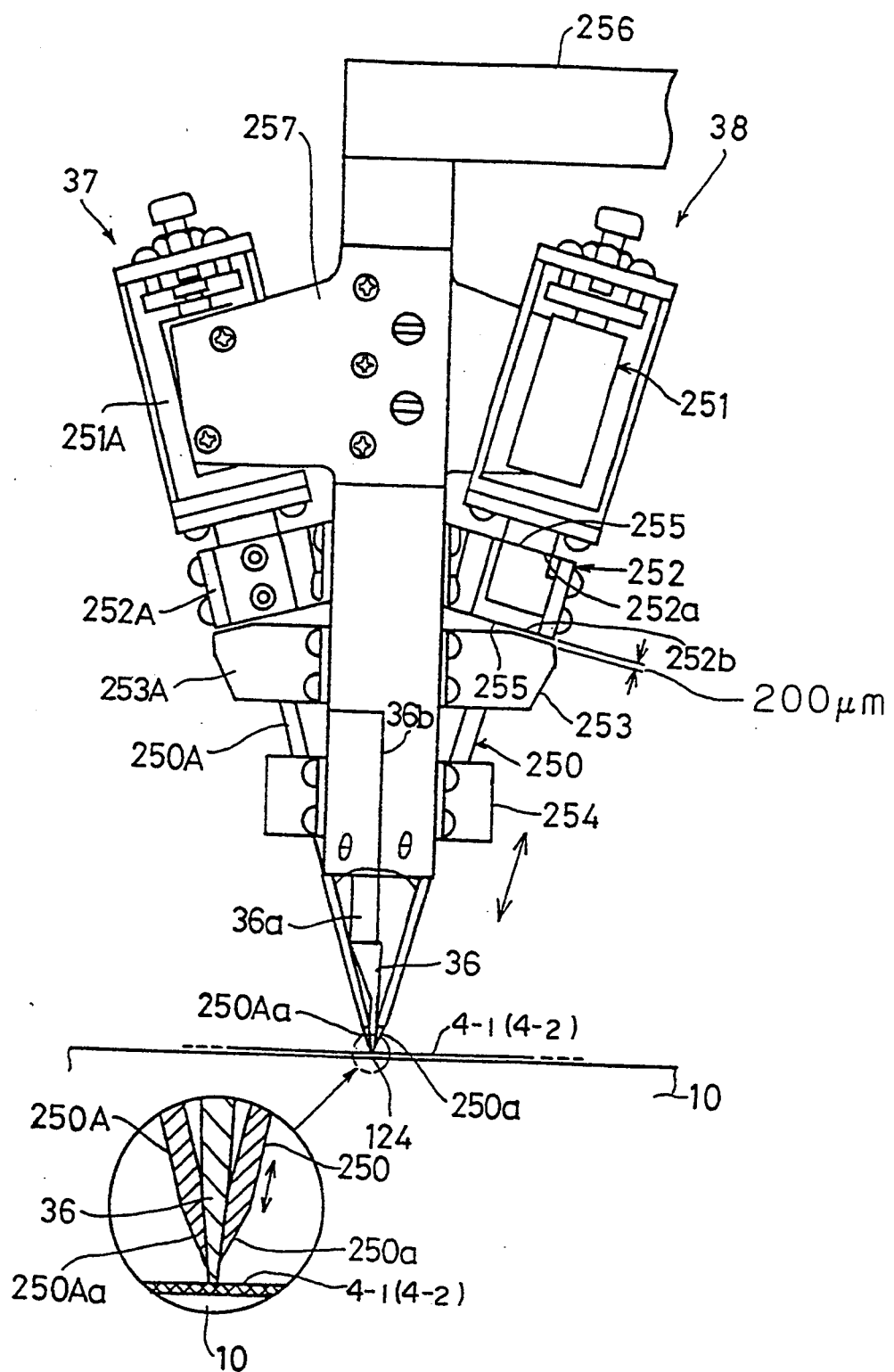
FIG. 32 is a diagram of a wire cutting mechanism shown in FIG. 5.
Figure 33A:
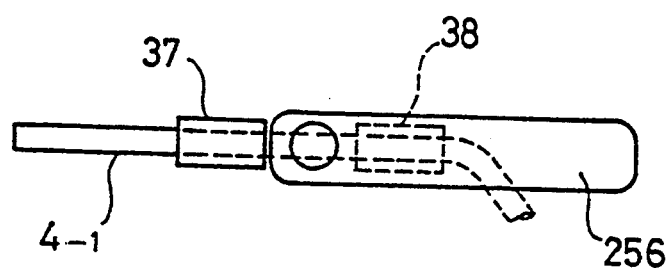
FIGS. 33A and 33B are respectively front and plan views of an outline of the structure shown in FIG. 32.
Figure 33B:
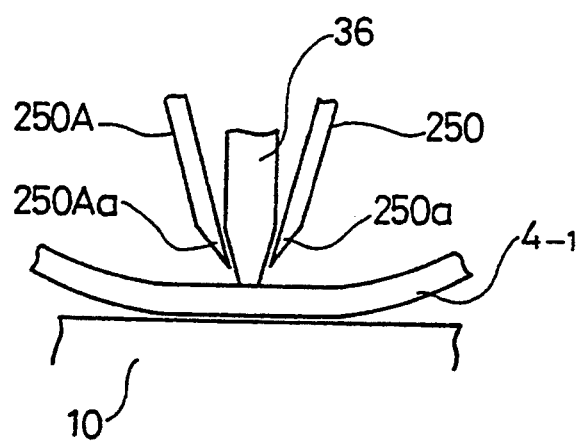

FIG. 32 shows the wire cutting mechanisms 37 and 38 in detail, and FIGS. 33A and 33B show a front and plan views thereof. The wedge 36 is provided with a heater and an electric cable built in the wedge 36. The wedge 36 becomes thick at a position slightly away from the end thereof. A reference number 36a indicates a thick portion of the wedge 36, that thick portion being one-sided.

The wire cutting mechanisms 38 and 37 have cutters 250 and 250A located on respective sides of the wedge 36 and are inclined at an angle of $\theta$ with respect to an axis 36b of the wedge 36. The inclined attachment of the cutters 250 and 250A prevents these cutters from interfering with the wedge 36, and makes it possible for the cutters to smoothly project from the wedge 36 to the wire cutting position.

As shown in FIG. 32, the wire cutting mechanism 38 is fixed to a frame 257, and is made up of the cutter 250, a linear movement actuator 251, a parallel spring mechanism 252, a stopper 253, a guide 254 and a strain gage 255. The other wire cutting mechanism 38 has the same structure as the wire cutting mechanism 37, and parts which correspond to those of the wire cutting mechanism 37 are given the same reference numbers with a suffix "A".

The cutter 250 is of a rod shape and has a blade 250a at one end thereof. The other end of the rod engages the linear movement actuator 251 having a solenoid coil. The linear movement actuator 251 forwards the blade 250a linearly along the axis of the linear movement actuator 251. The blade 250a forwarded by the actuator 251 forms a slit for cutting on the wire 4-1 located at the working position (bonding point 124).

The parallel spring mechanism 252 includes two leaf springs 252a and 252b, respective ends thereof are joined together. The surfaces of the leaf springs 252a and 252b are perpendicular to the axis of the cutter 250. One ends of the leaf springs 252a and 252b are fixed and the other ends thereof are connected to the cutter 250. When the leaf springs 252a and 252b are bent, the cutter 250 is moved linearly.

When the end of the parallel spring mechanism 252 comes into contact with the stopper 253, the linear movement 250 is interrupted, and the degree of forming a slit for cutting on the wipe 4-1 by means of the blade 250a is limited. This limit regarding the movement of the blade 250a is activated when the cutter 250 is moved approximately 200 μm. In this manner, it is possible to prevent the blade 250a from excessively forming a slit for cutting and thereby damaging the substrate 10.

The guide 254 functions to prevent bending of the leading end of the cutter 250 at the time of the wire cutting operation. However, it is possible to omit the guide 254. The strain gage 255 adheres to the surfaces of the two leaf springs 252a and 252b by means of an adhesive, and is used to detect the degree of strain of the parallel spring mechanism 252 (degree of bending of the leaf springs 252a and 252b), as will be described later. The wedge 36 is used to press the wire 4-1 to the bonding position on the substrate 10 at the time of wire bonding. An arm 256 supports the wedge 36, and is rotatable so as to orient the wedge 36 to the wiring direction.

Figure 34:
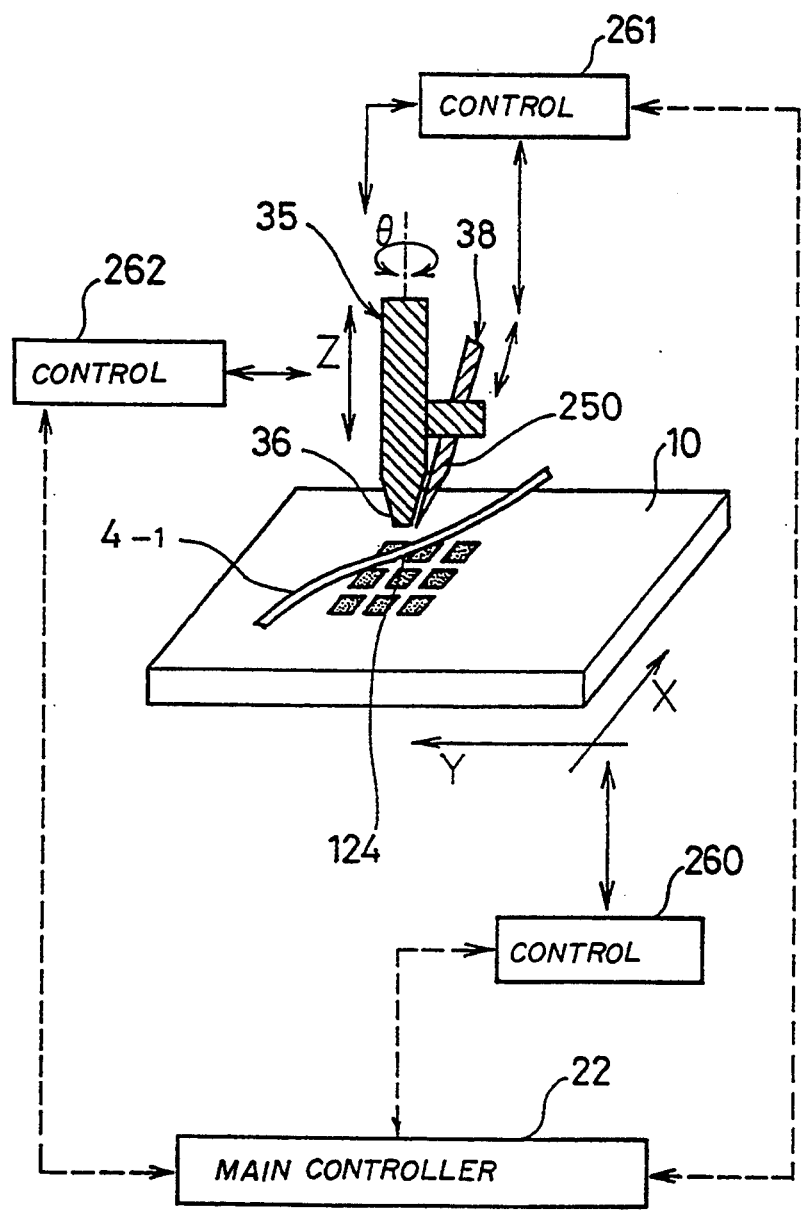
FIG. 34 is a diagram of a system structure of a wire cutting operation.

FIG. 34 shows a system structure of the wire cutting operation according to the embodiment of the present invention. Referring to FIG. 34, a control device 260 drives an X-Y-θ stage 32 so that the substrate 10 is moved in the X and Y direction in order to position the pad 16-1 on the substrate 10 in the bonding point 124. Control devices 261 and 262 control bonding and cutting of the wire 4-1 positioned in the bonding point 124. The cutting is performed by linearly moving the cutter 250 by providing the solenoid coil of the actuator 251 with electricity. Instructions of operations of the control devices 260, 261 and 262 are carried out by the main controller 22 for controlling the overall system.

When the wire 4-1 is cut, a history of variation in the degree of strain of the parallel leaf spring mechanism 242 is detected by means of the strain gage 245 shown in FIG. 29. Then, it is determined whether or not cutting is normally performed by comparing the history of variation in the degree of strain with that obtained when cutting is normally performed. The above detection is performed using a Wheatstone bride circuit in which the strain gage 245 is connected. A variation in the resistance of the strain gage 245 due to bending of the leaf springs 242a and 242b is monitored.

Figure 35:
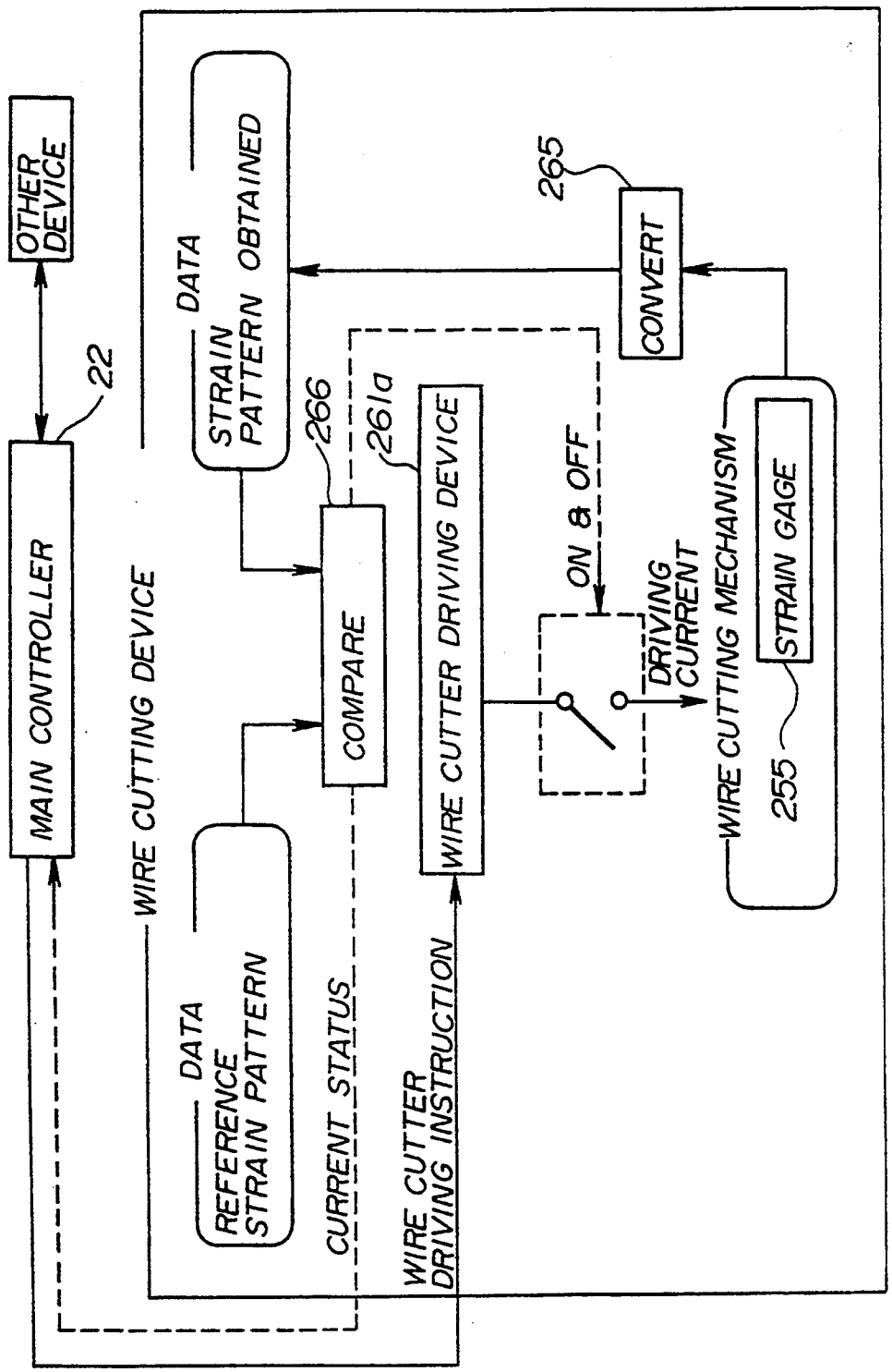
FIG. 35 is a diagram of a system structure for determining whether or not wire cutting has been normally performed.

FIG. 35 shows a system structure used to determine whether or not the cutting is normally performed. Referring to FIG. 35, in response to an instruction from the main controller 22, a wire cutter driving device 251a included in the controller device 261 drives the wire cutting mechanism. The linear movement of the cutter 250 is detected as a strain pattern of the parallel leaf springs 252a and 252b by using the resistance of the strain gage 245. A reference strain pattern observed when the cutting is normally performed is prepared beforehand. The strain pattern detected is compared with the reference strain pattern. When both the patterns match each other, it is concluded that the cutting has been normally performed. When both the patterns do not match each other, it is concluded that the cutting is abnormal. In this case, the cutting operation is interrupted in order to prevent an undesired effect to other devices before it happens.

Figure 36:
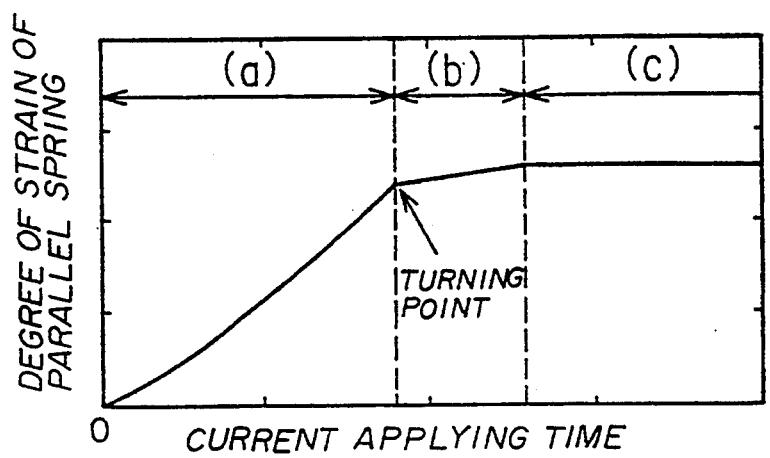
FIG. 36 is a graph of a characteristic observed when the degree of parallel-spring strain is normally varied.

FIG. 36 shows an example of the strain pattern observed when the cutting is normally performed. FIGS. 37 through 40 show examples of the strain pattern observed when the cutting is abnormal. In the graphs of FIGS. 36 through 40, the vertical axis denotes the degree of strain of the parallel spring mechanism 252, and the horizontal axis denotes a passage of time during which electricity is continuously supplied to the solenoid coil of the actuator 241.

In FIG. 36, a period (a) is necessary for the blade 250a to reach the wire 4-1. A period (b) is necessary for the blade 250a to be stopped by means of the limiter 253 after the blade 250a reaches the wire 4-1. A period (c) is a period after the blade 250a is stopped. The boundary between the periods (a) and (b) can be identified by detecting a turning point, and the boundary between the periods (b) and (c) can be identified by detecting whether or not the degree of strain of the parallel spring mechanism 252 becomes constant.

Figure 37:
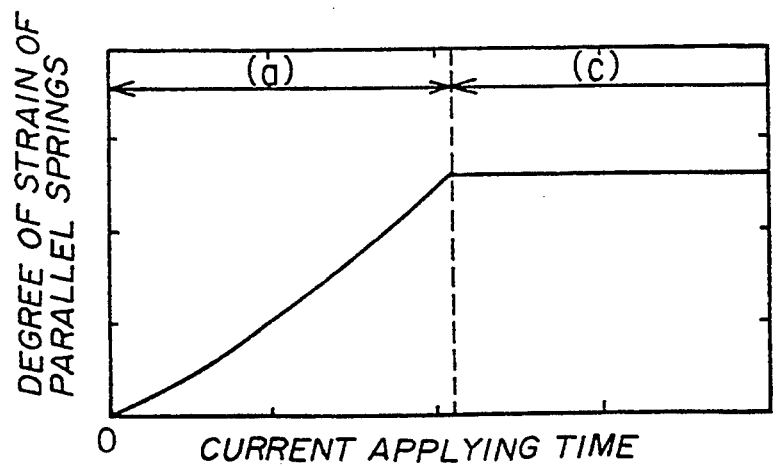
FIG. 37 is a graph of a first characteristic observed when the degree of parallel-spring strain is abnormally varied.

The strain pattern shown in FIG. 37 does not have the period (b). This means that the cutter 250 does not cut the wire 4-1. This may be because the cutter 250 is chipped or because the wire 4-1 is not located in the predetermined position.

Figure 38:
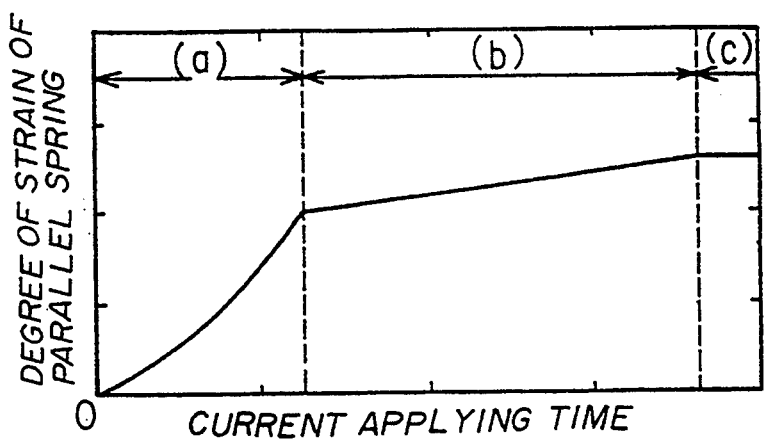
FIG. 38 is a graph of a second characteristic observed when the degree of parallel-spring strain is abnormally varied.

The strain pattern shown in FIG. 38 has a period (b) longer than that of the normal strain pattern. This means that the speed of cutting the wire 4-1 is slow. This may be because the blade 250a is defective or because the wire 4-1 is defective.

Figure 39:
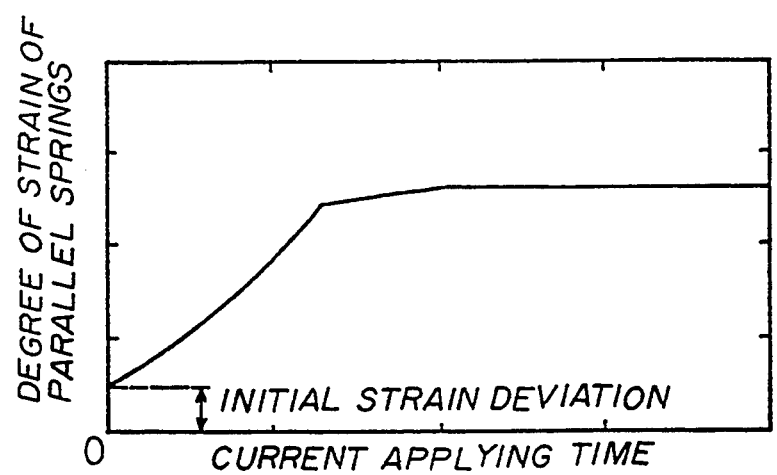
FIG. 39 is a graph of a third characteristic observed when the degree of parallel-spring strain is abnormally varied.

The strain pattern shown in FIG. 39 is observed when there is a strain at the initial state. This may be because the parallel leaf springs 252 or other members of the wire cutting mechanism have been deformed.

Figure 40:
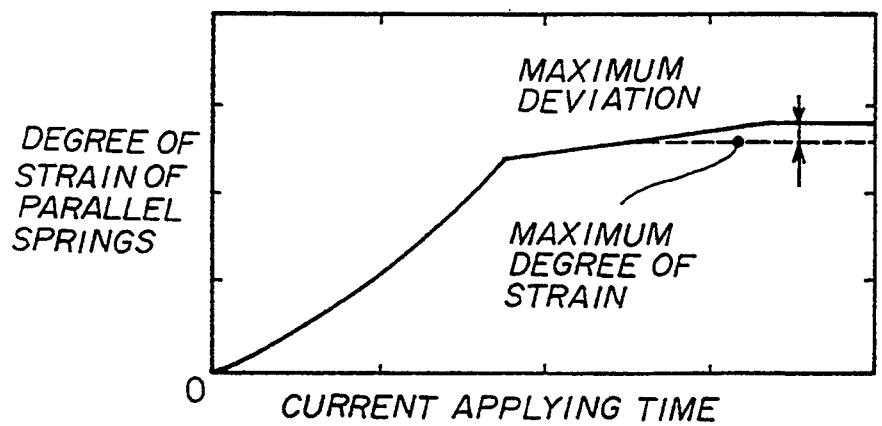
FIG. 40 is a graph of a fourth characteristic observed when the degree of parallel-spring strain is abnormally varied.

The strain pattern shown in FIG. 40 is observed when the degree of strain of the parallel leaf spring mechanism 252 in the period (c) is greater than that normally observed. This may be because the position of the limiter 253 deviates from the predetermined position. In this case, the cutter 250 may damage the substrate 10.

HANDS 60 AND 70 FOR SINGLE WIRES

A description will now be given of the hands 60 and 70 for the single wires shown in FIG. 5.

Figure 41:
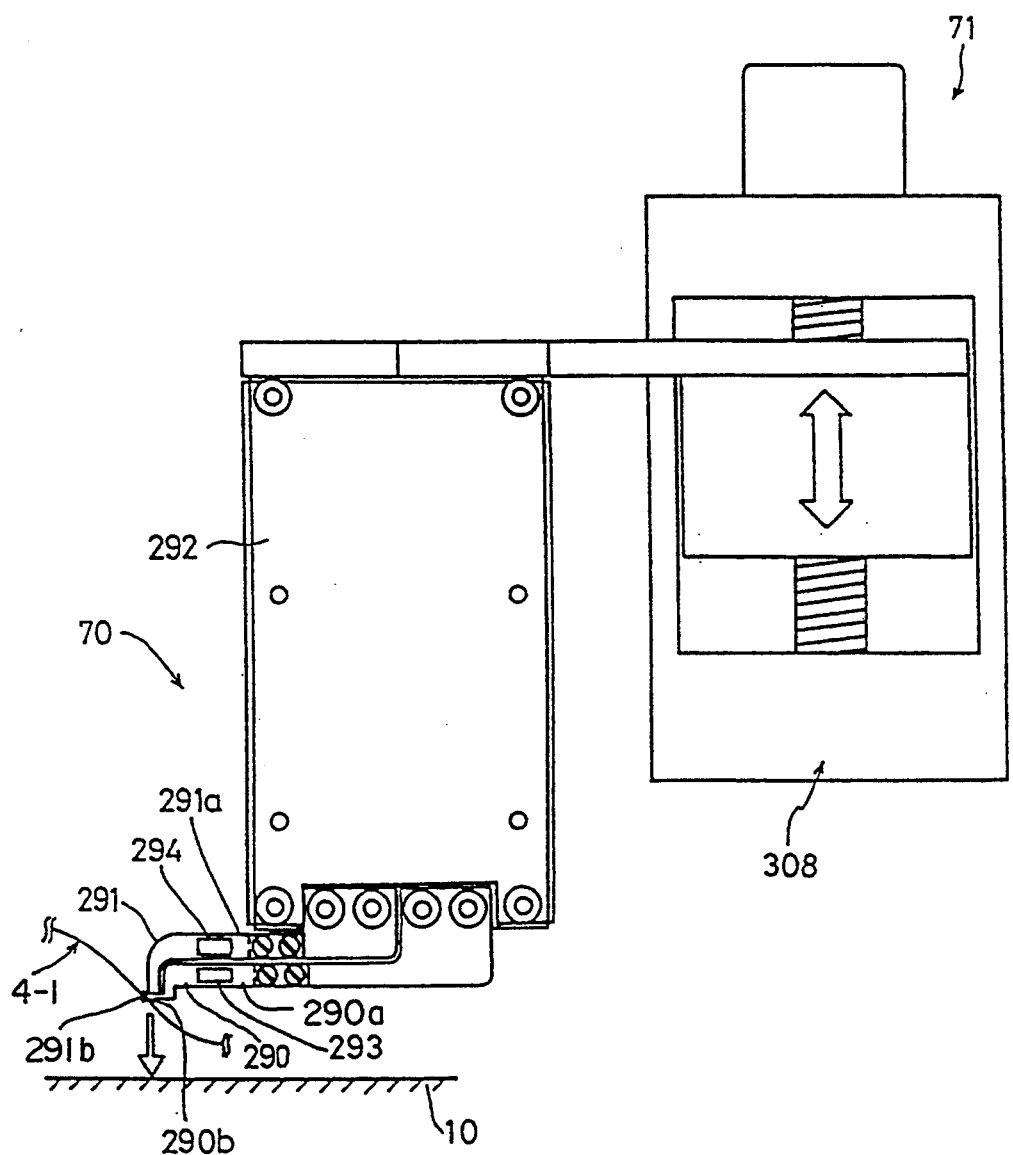
FIG. 41 is a diagram of a hand 70 for holding a single wire shown in FIG. 5.
Figure 42:
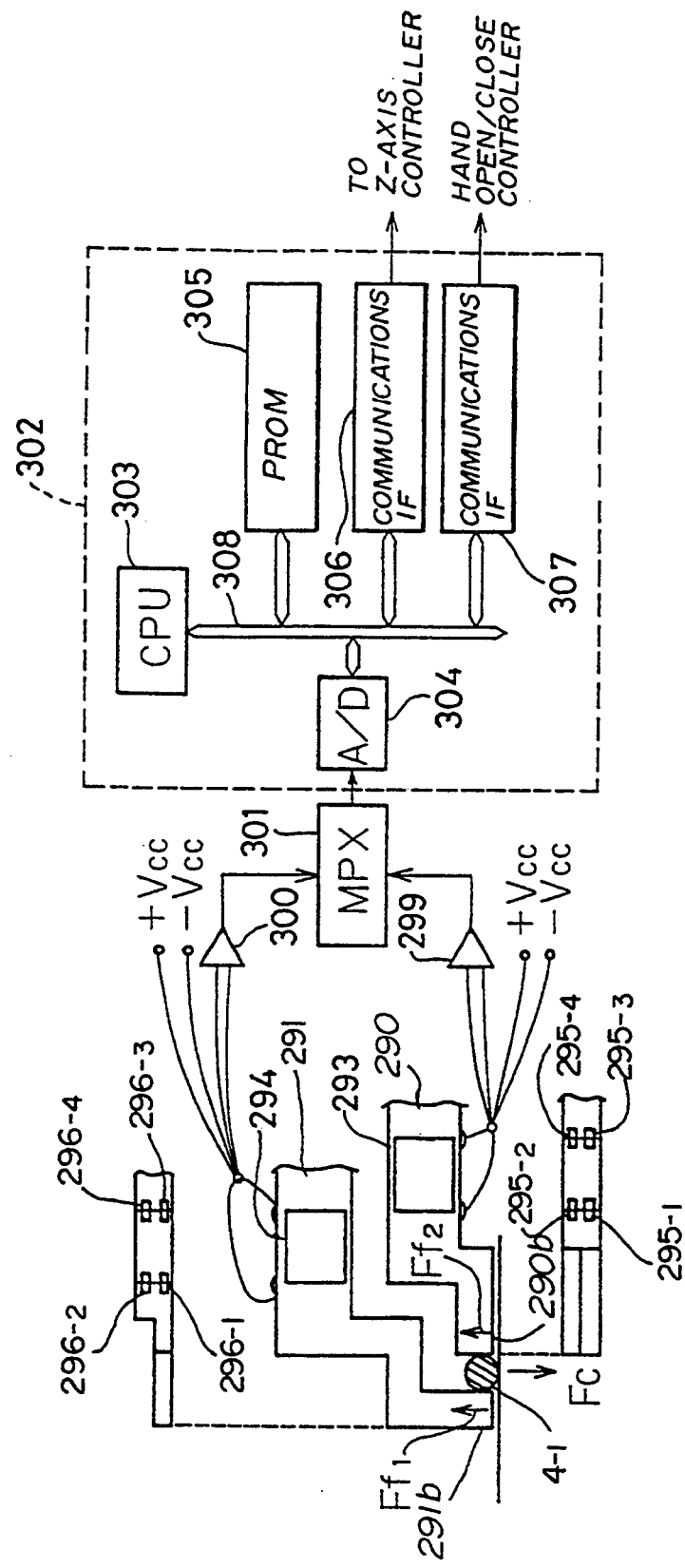
FIG. 42 is a diagram of a finger part and associated parts shown in FIG. 41.
Figure 43:
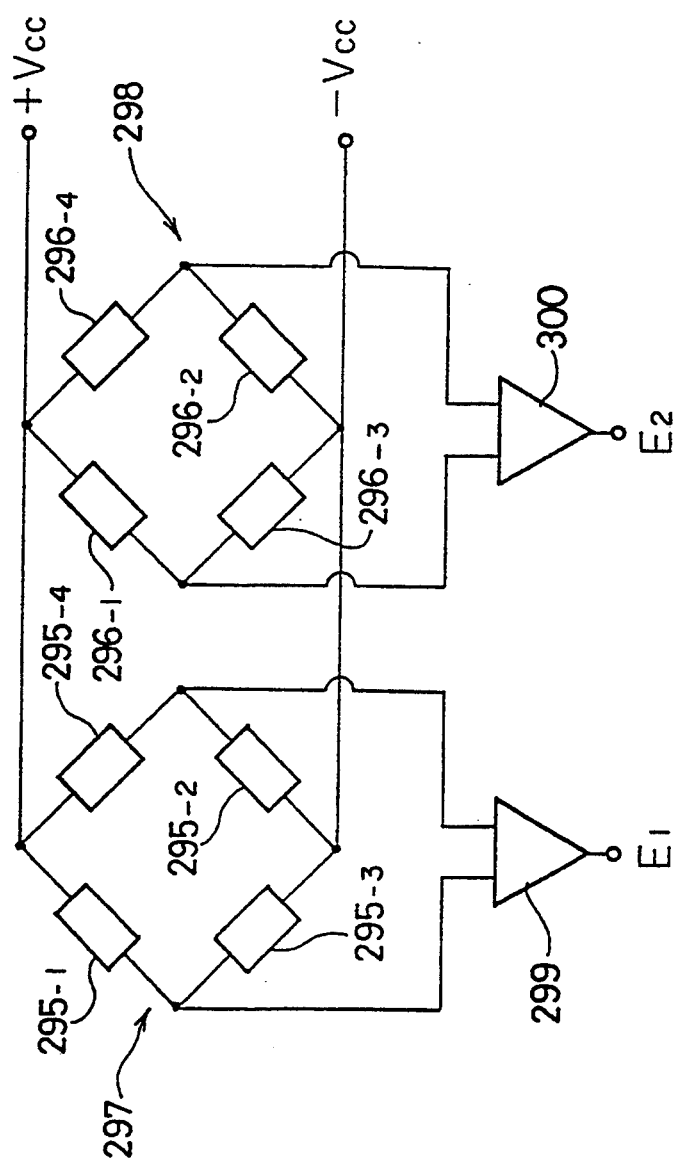
FIG. 43 is a circuit diagram of a circuit formed with a strain gage.

FIG. 41 shows a part of the hand 70 for the single wire, and a part of the hand moving mechanism 71. Fingers 290 and 291 are of respective L-shaped members, and are opened and closed by a hand open/close driving mechanism 292. Main bodies 290a and 291a of the fingers 290 and 291 are respectively provided with parallel spring parts 293 and 294, as shown in FIG. 42. Strain gages 295-1 through 295-4 are attached to the parallel leaf spring part 293. Similarly, strain gages 295-1 through 295-4 are attached to the parallel leaf spring part 294. The strain gages 295-1 through 295-4 and 296-1 through 296-4 form Wheatstone bride circuits 297 and 298, as shown in FIG. 43. A force detector is formed by the parallel leaf spring parts 293 and 294, and the Wheatstone bride circuits 297 and 298 (strain gages 295-1 through 295-4 and 296-1 through 296-4).

An output signal of the circuit 297 is applied to a differential amplifier 299, and an output of the circuit 298 is applied to a differential amplifier 300. Outputs of the differential amplifiers 299 and 300 are applied to a multiplexer 301, which is connected to a microcomputer 302. The microcomputer 302 is made up of a CPU 303, an A/D converter 304, a programmable ROM 305, interfaces 306 and 307, and a bus 308. The interface 306 sends an instruction signal to a controller (not shown) for the Z-axis stage 308 shown in FIG. 41. The interface 307 sends an instruction signal to a controller (not shown) for the hand open/close driving mechanism 292 shown in FIG. 41.

The inventors measured the relationship between digital conversion values Ed1 and Ed2, which are respectively the output signals of the differential amplifiers 299 and 300 and forces Ff1 and Ff2 oriented in the Z-axis direction of the fingers 290b and 291b, and found that the above relationship is linear. Hence, the forces Ff1 and Ff2 can be obtained by the following equations:

$$Ff1 = K1 \cdot Ed1,$$

$$Ff2 = K2 \cdot Ed2$$

where K1 and K2 are constants.

A constant force Fe obtained when the Z-axis stage 308 is moved down and the fingers 290b and 291b come into contact with the printed circuit board 10 can be obtained as follows:

$$Fc = Ff1 + Ff2 = K1 \cdot Ed1 + K2 \cdot Ed2.$$

The stage 308 is controlled so that the contact force Fc is constant, and is stopped when the contact force Fc becomes greater than a threshold value.

Figure 44:
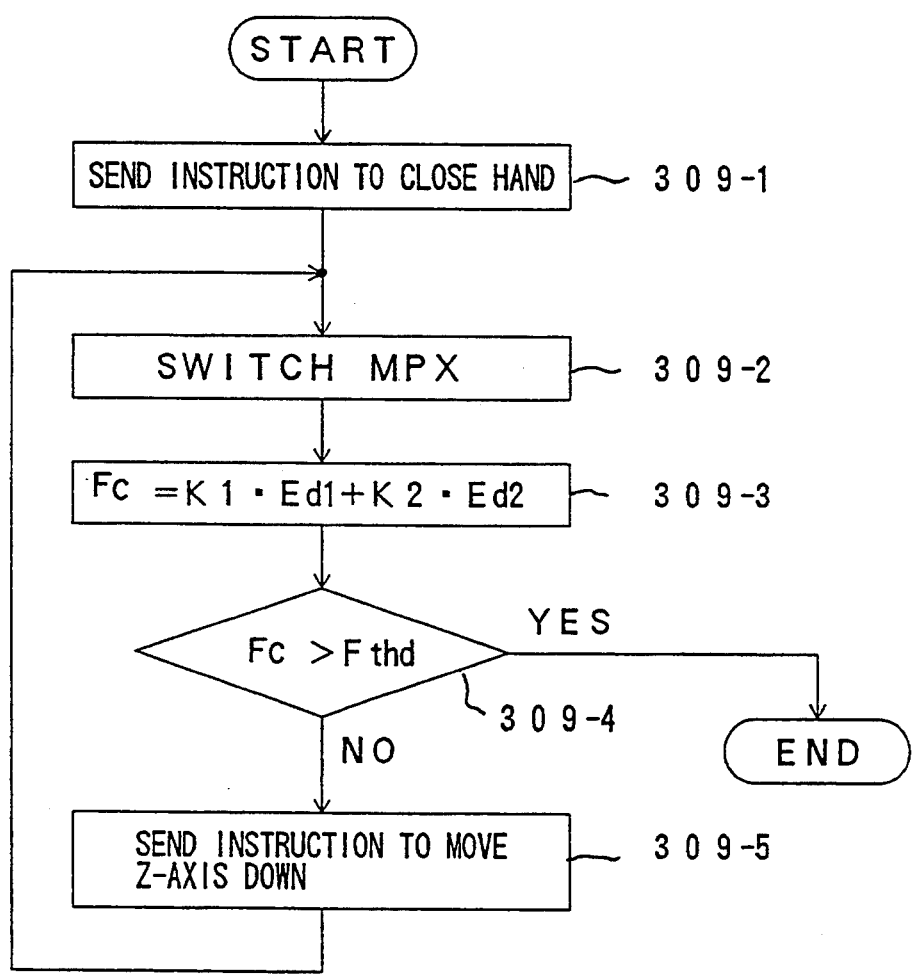
FIG. 44 is a flowchart of the operation of a microcomputer 302 shown in FIG. 42.

FIG. 44 is a flowchart of the operation of the microcomputer 302 shown in FIG. 42. The microcomputer 302 sends an instruction to close the hand (step 309-1). Next, the microcomputer 302 switches the multiplexer 301 and has the A/D converter receive two force signals (step 309-2). Then, the microcomputer 302 calculates the following equation:

$$Fc = K1 \cdot Ed1 + K2 \cdot Ed2 \text{ (step 309-3)}.$$

Then, the microcomputer 302 determines whether or not the contact force Fc exceeds a threshold value Fthd (step 309-4). When the result of step 309-4 is NO, the microcomputer 302 sends an instruction to move the Z axis down (step 309-5). When the result of step 309-4 is YES, the microcomputer 302 terminates the operation. Hence, the Z-axis stage 308 is caused to stop moving, and the printed circuit board 10 can be prevented from being damaged due to excessive force exerted thereon.

HAND 60 FOR TWIN WIRES

A description will now be given of the hand 60 for the twin wires shown in FIG. 5.

Figure 45:
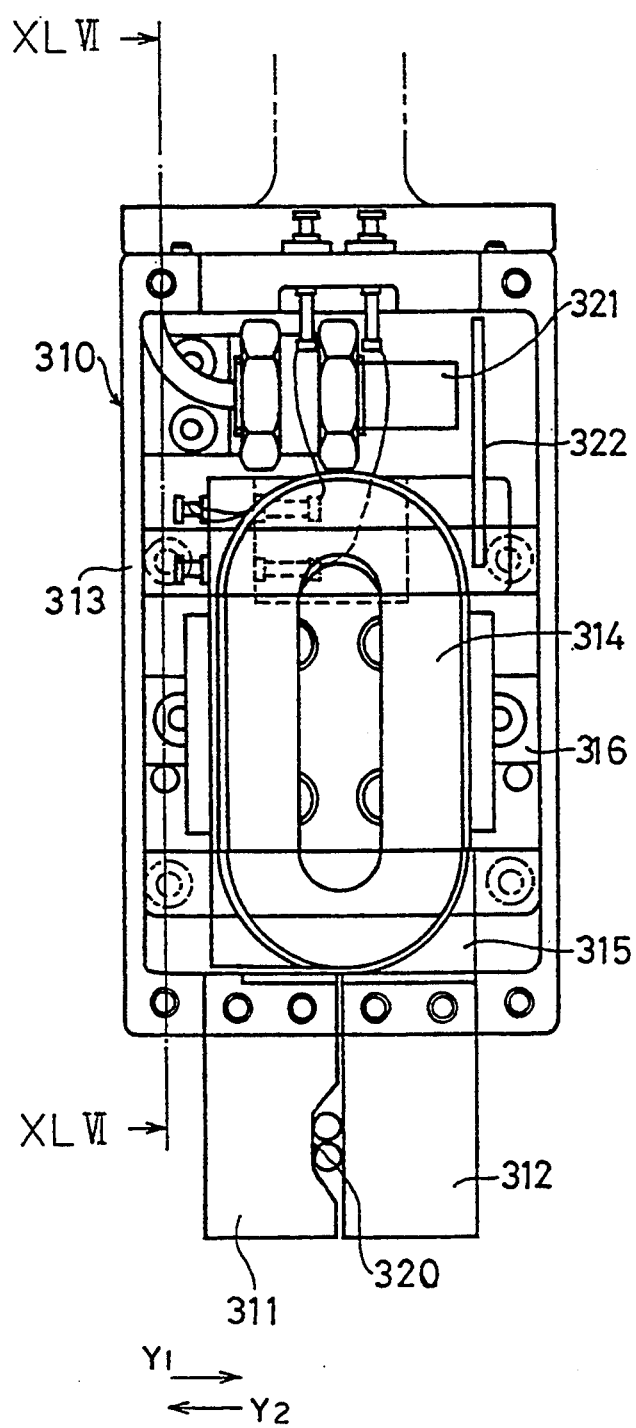
FIG. 45 is a diagram of the hand for twin wires from which a cover of a hand open/close driving mechanism is removed.
Figure 46:
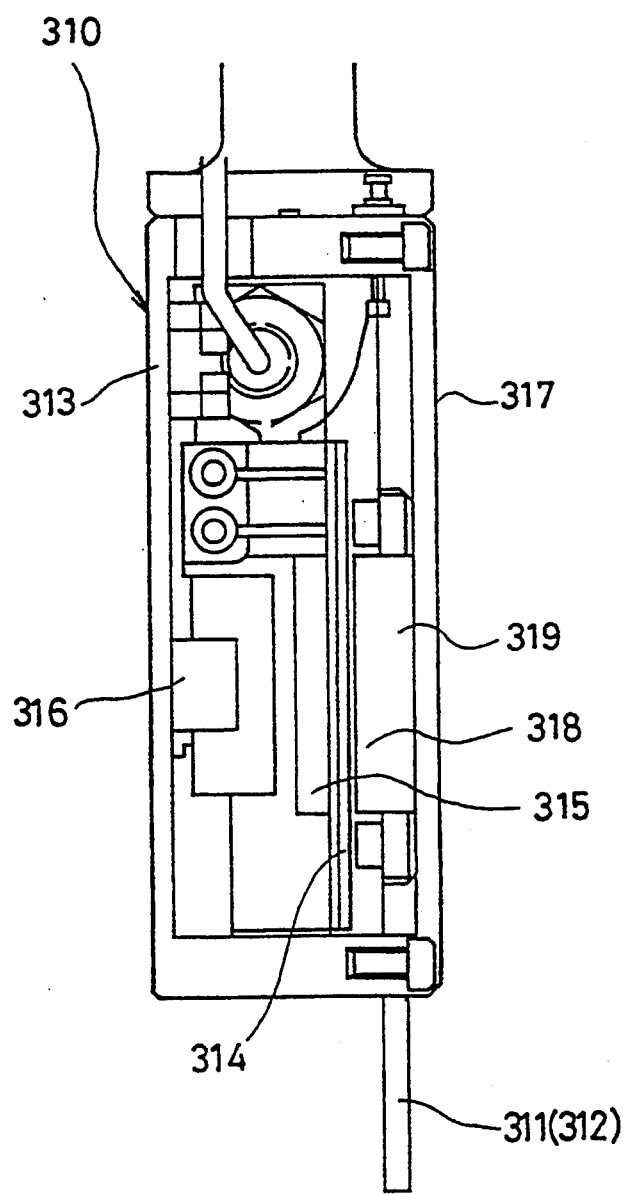
FIG. 46 is a cross-sectional view taken along line XLVI—XLVI shown in FIG. 45.
Figure 47:
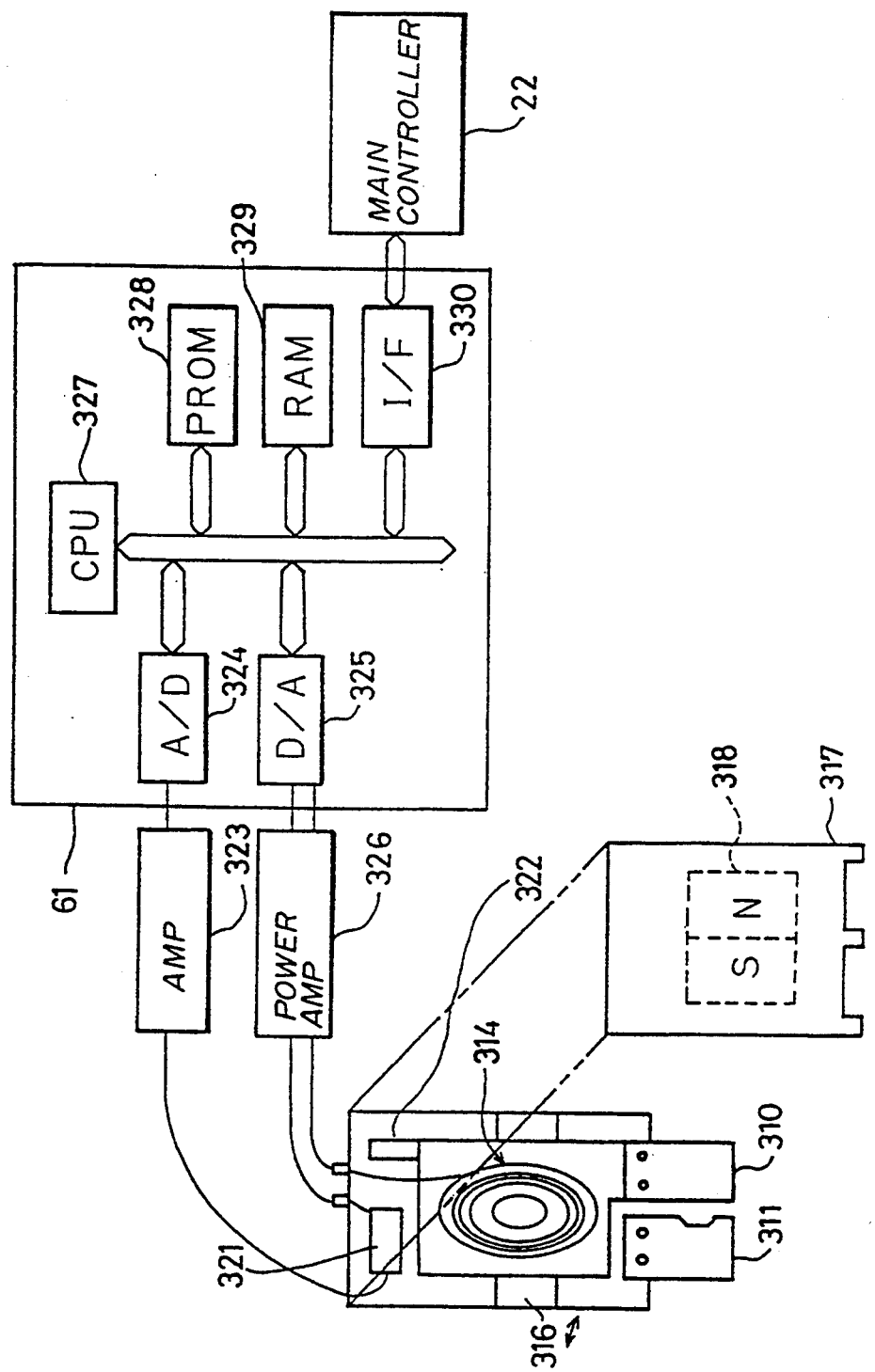
FIG. 47 is a diagram of an overview of the hand for twin wires shown in FIG. 45.

As shown in FIGS. 45, 46 and 47, the hand 60 for the twin wires is made up of the hand open/close driving mechanism 310, a stationary finger 311 and a movable fingers 312. The mechanism 310 is configured as follows. A yoke 315 to which a plate-shaped coil 314 is fixed is movably supported by a linear guide 316 in the directions indicated by the arrows Y1 and Y2. A permanent magnet 318 and a yoke 319 are attached to an inner surface of a cover 317 of a main body of the mechanism 310. The coil 314 and the permanent magnet 318 are close to and opposite to each other, and form a linear motor. The stationary finger 311 has a cutout part 320 of a trapezoidal shape, and is fixed to a box body 313. The movable finger 312 is fixed to the yoke 315. A non-contact displacement sensor 321 of an eddy current type is provided in the box body 313. A steep plate 322 for use in displacement detection is attached to the yoke 315, and faces the displacement sensor 321.

In FIG. 47, the output signal of the sensor 321 is amplified by an amplifier 323, and is sampled, as information indicating the position of the movable finger 312 by means of an A/D converter 324 in the controller 61 (see FIG. 47) for use in force control. The controller 61 sends voltage information to a power amplifier 326 via a D/A converter 325. Hence, a current proportional to a voltage indicated by the voltage information is supplied to the coil 314. The controller 61 includes, in addition to the A/D converter 324 and the D/A converter 325, a CPU 327, a PROM 328, a RAM 329, and an I/F 330. Further, the controller 61 is connected to the main controller 22.

The fingers 213 and 311 are opened or closed by current control. More particularly, the main controller 22 sends grasp force information to the controller 61. The hand controller 22 calculates [(grasp force)/(gain of power amplifier 326)], and outputs a voltage thus calculated to the power amplifier 326. The grasp width of the fingers 312 and 311 is controlled by displacement control. More specifically, the controller 61 performs a PID compensation operation [(current operating amount)/(gain of power amplifier 326)] on a deviation between an instructed amount and a sampling displacement, and outputs a voltage thus calculated to the power amplifier 326.

Figure 48:
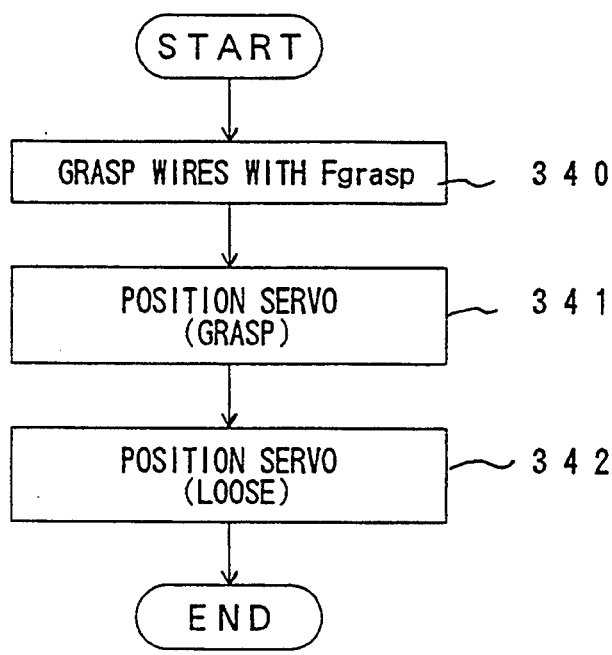
FIG. 48 is a flowchart of a process for obtaining a loose state shown in FIG. 12B.

A description will now be given of an operation of the controller 61 for setting the hand 60 to the loose state shown in FIG. 12B. Referring to FIG. 48, the controller 61 executes step 340 in which the twin wires 1 are grasped with a desired grasp force Fgrasp. The controller 61 performs a position servo control so as to target a displacement of the ends of the finger grasping the twin wire 1 in step 341. Hence, the hand 60 is changed from the released state shown in FIG. 12C to the grasped state shown in FIG. 12A in which the grasp force is generated. The grasp displacement is determined in the state in which the twin wires 1 are firmly grasped.

The controller 61 performs the position servo operation so as to target displacement of the ends of the fingers in step 342. Hence, the hand 60 is controlled so that it is displaced in the open-oriented direction by a predetermined distance (20 μm for example) with respect to the displacement position of the grasped state shown in FIG. 12A. Hence, it is possible to determine the loose state irrespective of a dispersion of the wire size.

Steps 340, 341 and 342 shown in FIG. 48 will be described in more detail.

Figure 49:
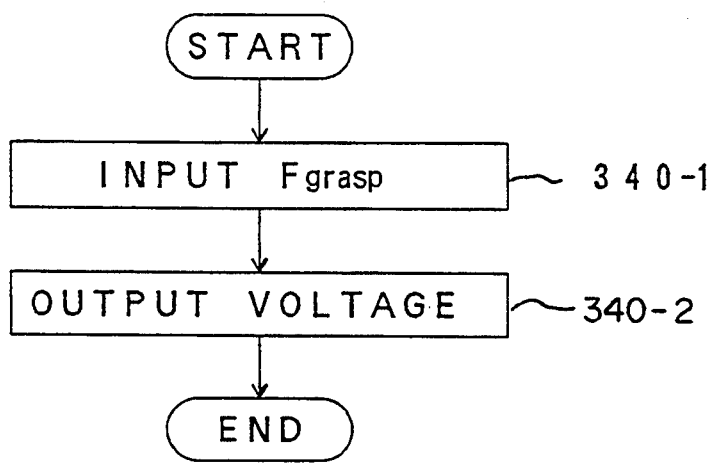
FIG. 49 is a flowchart of the details of step 340 shown in FIG. 48.

(1) Step 340 (see FIG. 49)

The value of Fgrasp is input from the main controller 22 (step 340-1). Next, the controller 61 calculates (Fgrasp)/(force constant of motor)/(power amplifier gain), and a voltage thus calculated is output to the D/A converter 325 (step 340-2).

Figure 50:
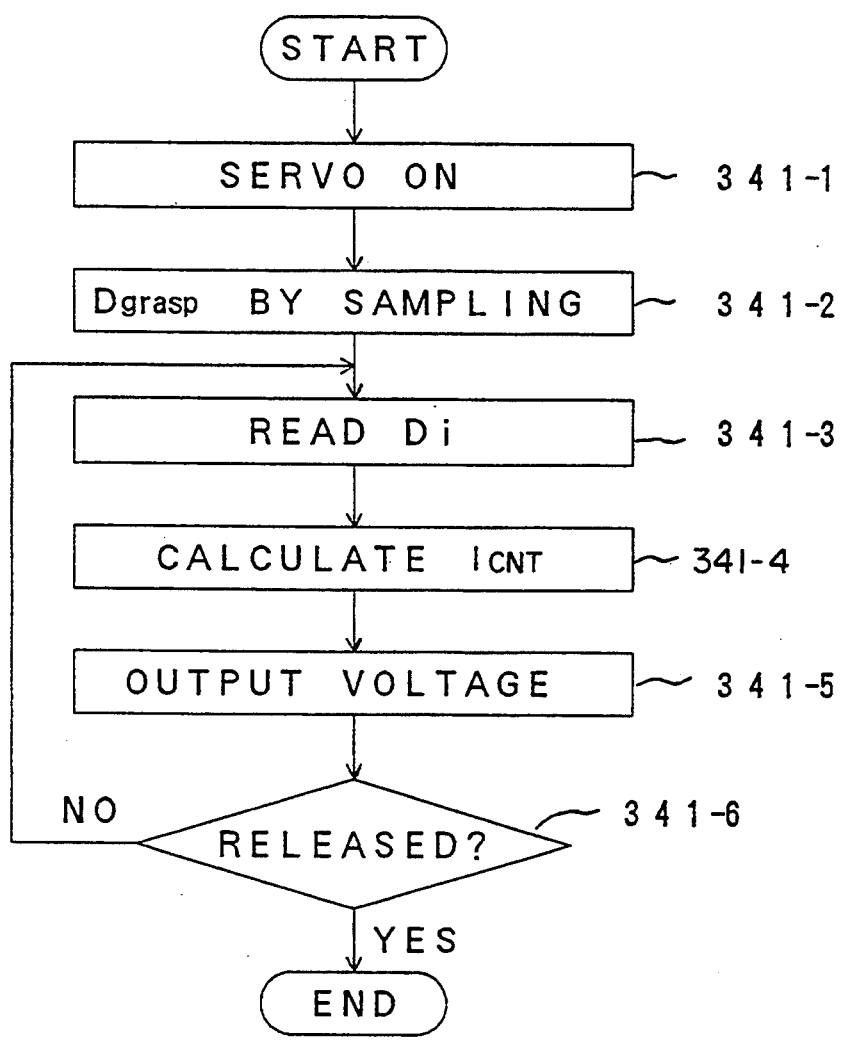
FIG. 50 is a flowchart of the details of step 341 shown in FIG. 48.

(2) Step 341 (see FIG. 50)

The controller 61 instructs serve-ON (step 341-1). Next, the controller 61 samples the signal from the A/D converter 324 to obtain a grasp displacement Dgrasp (step 341-2). Then, the controller 61 reads finger-end displacement Di from the A/D converter 324 every sampling period (step 341-3). Thereafter, the controller 61 feeds back the finger-end displacement Din, and performs a servo operation in which Dgrasp is the target of the servo operation. Hence, a current operation amount $I_{CNT}$ is calculated (step 341-4). Then, the controller 61 calculates $(I_{CNT})$/(force constant of motor)/(gain of power amplifier 326), and outputs a voltage thus calculated to the D/A converter 325 (step 341-5).

Figure 51:
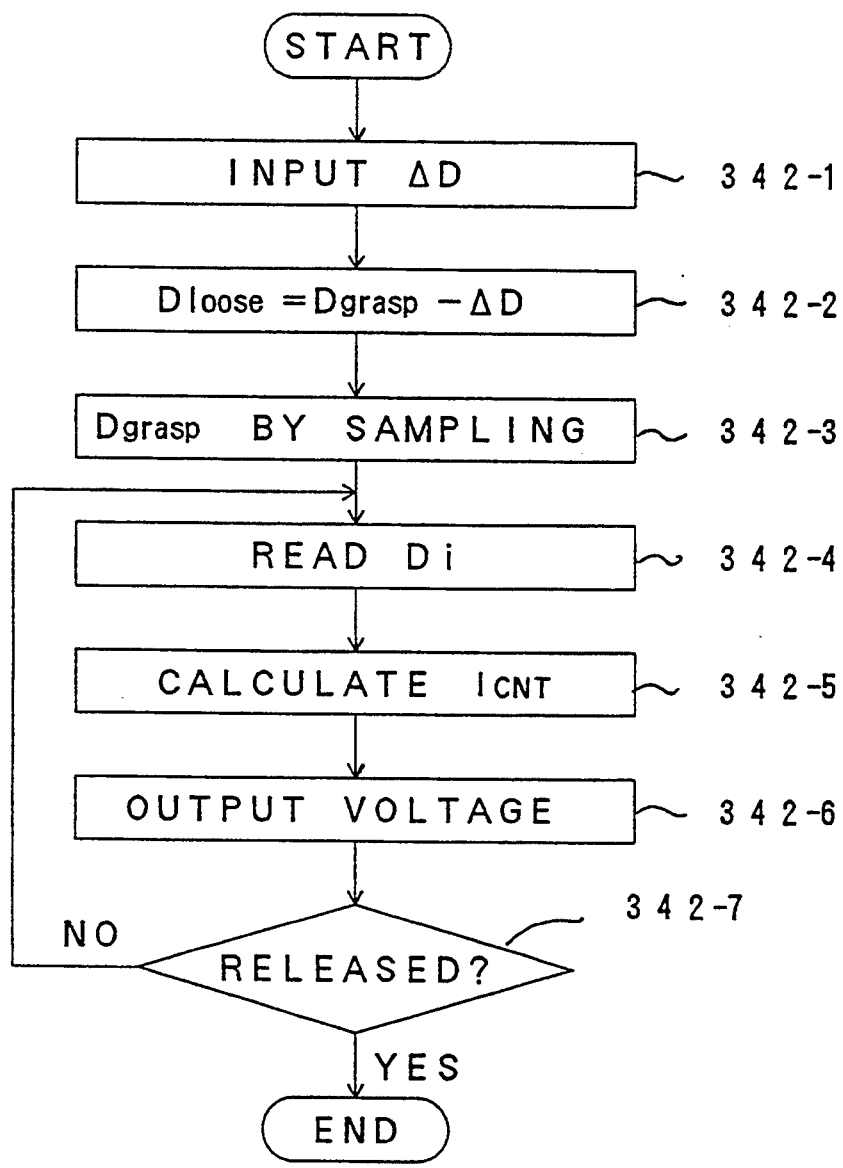
FIG. 51 is a flowchart showing the details of step 342 shown in FIG. 48.

(3) Step 342 (see FIG. 51)

The controller 61 receives a value (20 μm, for example) of an open width delta-D necessary to set the hand 60 to the loose state from the main controller 22 (step 342-1). Next, the controller 61 calculates a loose-finger-end displacement Dloose (=Dgrasp−deltaD) in step 342-2. Then, the controller 61 samples the signal from the A/D converter 324, and sets it as the grasp displacement Dgrasp. Thereafter, the controller 61 reads finger-end displacement Di from the A/D converter 324 every sampling period (step 343-4). Then, the controller 61 detects Di, and performs a position feedback control in which Dloose is the target. Hence, a current operation amount $I_{CUT}$ is calculated (step 342-5). Thereafter, the controller 61 calculates $[(I_{CUT})$/(force constant of motor)/(gain of power amplifier 326)], and outputs a voltage thus calculated to the D/A converter 325 (step 342-6).

ANOTHER EMBODIMENT OF WIRING METHOD

A description will now be given of another embodiment of the wiring method according to the present invention. The wiring method of the present embodiment is performed by the wiring device 20 shown in FIG. 5.

Figure 52:
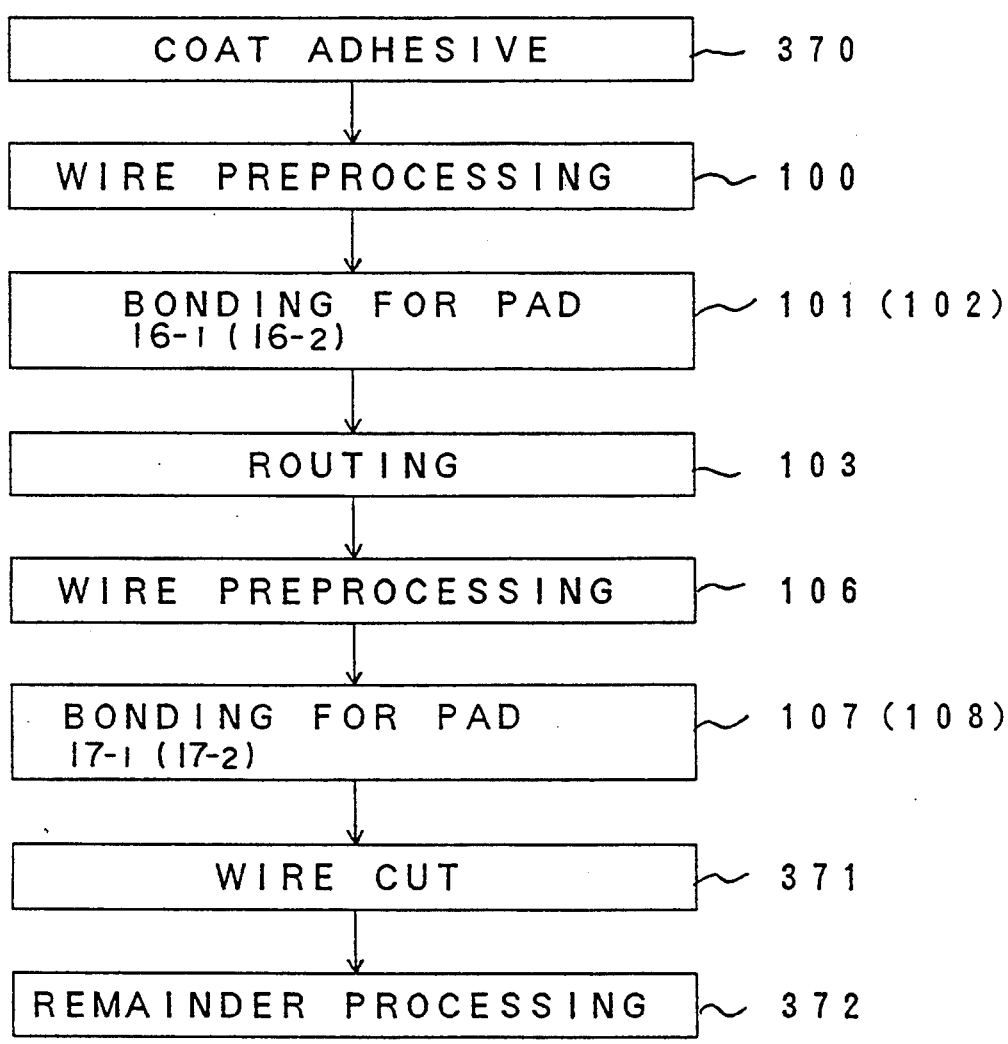
FIG. 52 is a flowchart of a wiring method according to another embodiment of the present invention.

FIG. 52 shows the wiring method according to the embodiment being considered. In FIG. 52, parts that are the same as parts shown in FIG. 13 are given the same reference numbers. The embodiment being considered is characterized in the last step 372 for processing the remainder of the wires.

Figure 53:
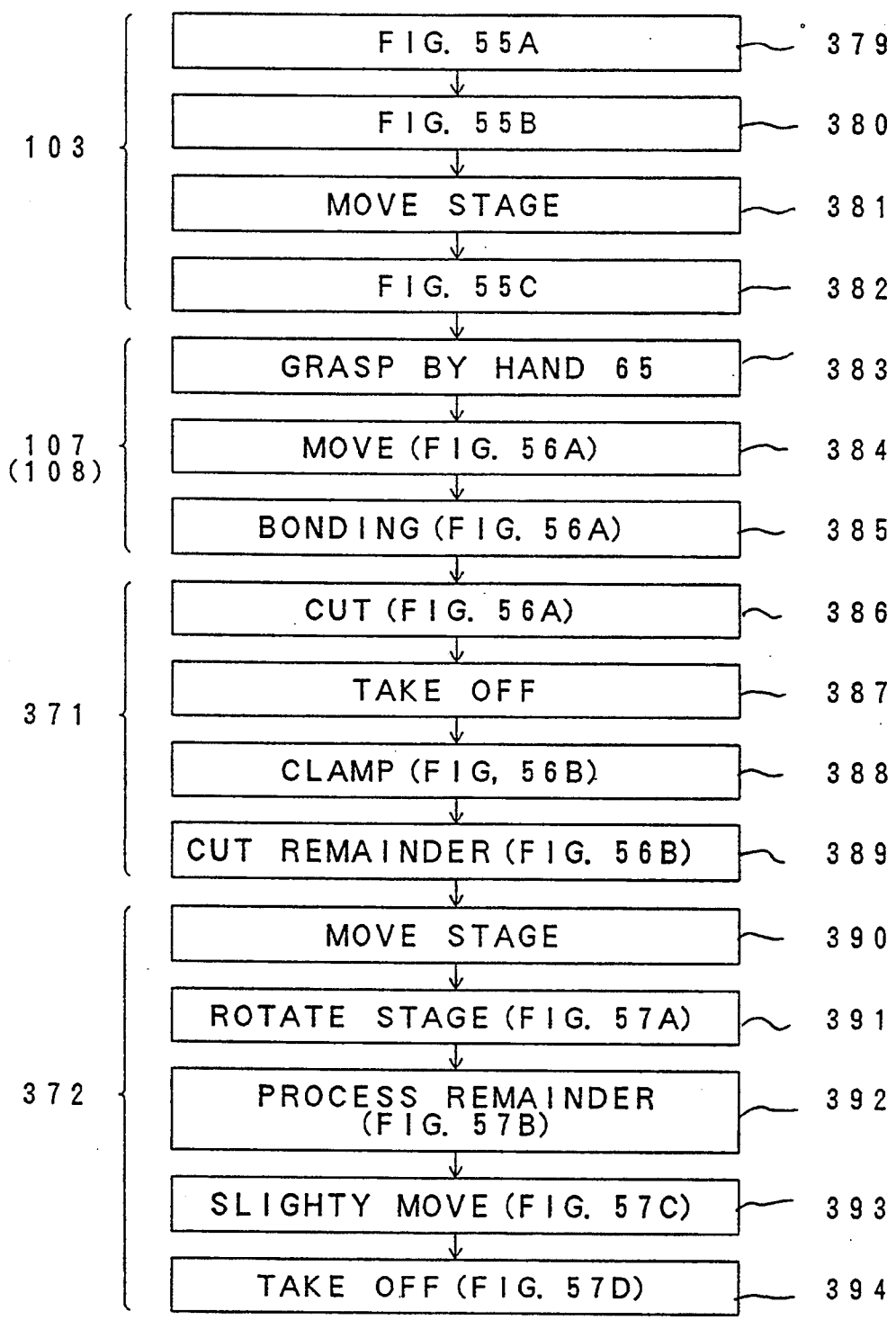
FIG. 53 is a flowchart of the details of some steps shown in FIG. 52.
Figure 54A:
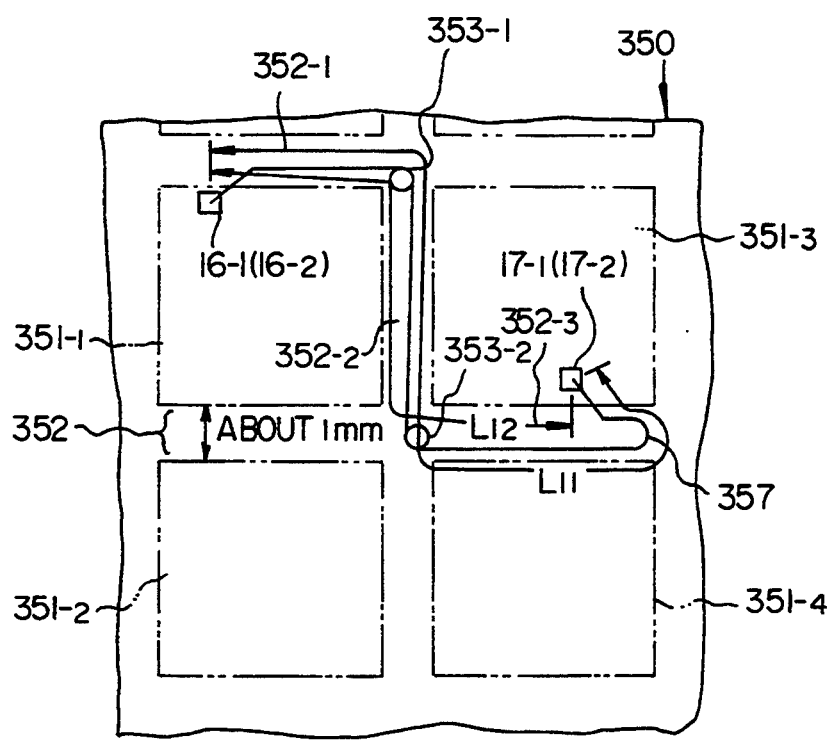
FIGS. 54A and 54B are diagrams of a state in which twin wires are laid.
Figure 54B:
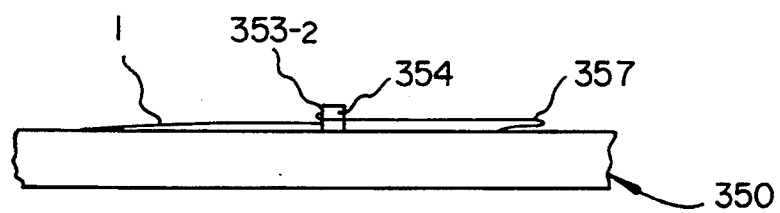

FIG. 53 shows some steps shown in FIG. 52 in more detail. FIGS. 54A and 54B show states of wires arranged by the process shown in FIG. 52. In FIG. 53, a printed circuit board 350 has a structure having the functions of interposers 12 shown in FIGS. 2 and 31. The interposers 12 are not provided on an upper surface of the printed circuit board 350, and IC mounting programmed portions 351-1 through 351-4 are arranged so that a matrix thereof is formed. Lattice areas having a small width (approximately equal to 1 mm) and defined by the IC mounting programmed portions 351-1 through 351-4 serve as wire routing paths 352. Routing guides 353-1 and 353-2 having a cylindrical shape are buried in a position where the wire routing paths 352 cross each other.

The wiring method according to the embodiment being concerned will now be described by referring to an example shown in FIG. 54A in which the twin wires 1 are connected to pads.

[1] Adhesive Coating Step 370

An adhesive 354 is coated on the routing guides 353-1 and 353-2 formed on the printed circuit board 350 placed on the X-Y-0 stage 32. This step is performed in order to prevent the wires 1 from being taken away from the routing guide 353-1 or the like.

[2] Wire Preprocessing Step 100

This step is performed in the same manner as has been described previously.

[3] Bonding s 101 (102) for Pad 16-1 (16-2)

This step is also performed in the same manner as has been described previously.

[4] Routing Step 103

Step 379

The stage 32 is moved in the state in which the twin wires 1 are held in the loose state (FIG. 12B) by means of the hand 60 for the twin wires. Thereby, the printed circuit board 350 is moved, and the twin wires 1 are drawn. Then, as shown in FIG. 54, the twin wires 1 are routed along the wire routing path 352-1, routing guide 353-1 (bent at a right angle), the wire routing path 353-2, the routing guide 353-2 (bent at a right angle), and the wire routing path 352-3. FIG. 55A shows a state in which the twin wires 1 have been laid up to the wire routing path 352-2. The hand 60 is maintained in the loose state, and the twin wires 1 are stretched by the tension applying mechanism 50.

(1) Step 380 (FIG. 55B)

The stage 22 is rotated clockwise by 90°. Thereby, the twin wires 1 are bent by 90°. A bent part of the twin wipes 1 is made to adhere to the surface of the routing guide 353-2, and the twin wires 1 are laid along the wire Pouting path 352-3.

(2) Step 381

The stage 32 is moved in the X1 direction so that the axis of rotation corresponds to the position of the hand 60.

(3) Step 382 (FIG. 55C)

The state 32 is clockwise rotated by 45°. Hence, the pad 17-1 (17-2) is positioned just below the twin wires 1 extending from the hand 60 to the wire tension applying mechanism 50.

[5] Wire Preprocessing Step 106

This step is performed in the same manner as has been described previously.

[6] Bonding Step 107 (108) for Pad 17-1 (17-2)

(1) Step 383 (FIG. 55C)

The hand 65 (70) grasps the wire in the vicinity of the wire splitting mechanism 47.

Figure 56A:
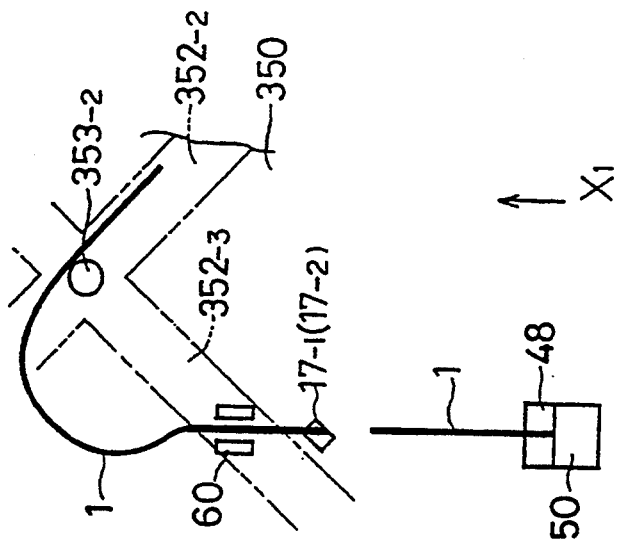
FIGS. 56A and 56B are diagrams of a wire bonding step.

(2) Step 384 (FIG. 56A)

The hand 65 (70) is moved so that a portion of the twin wires 1 to be bonded become located above the pad 17-1 (17-2).

(3) Step 385 (FIG. 56A)

The wire bonder 35 is operated so that the wire bonder 35 is moved down and the wire is bonded to the pad 17-1 (17-2).

[7] Wire Cutting Step 371

(1) Step 386 (FIG. 56A)

The wire cutting mechanism 37 is operated so that a slit for cutting is formed on the twin wires 1.

(2) Step 387 (FIG. 56A)

The hand 65 (70) is taken away from the wire.

Figure 56B:
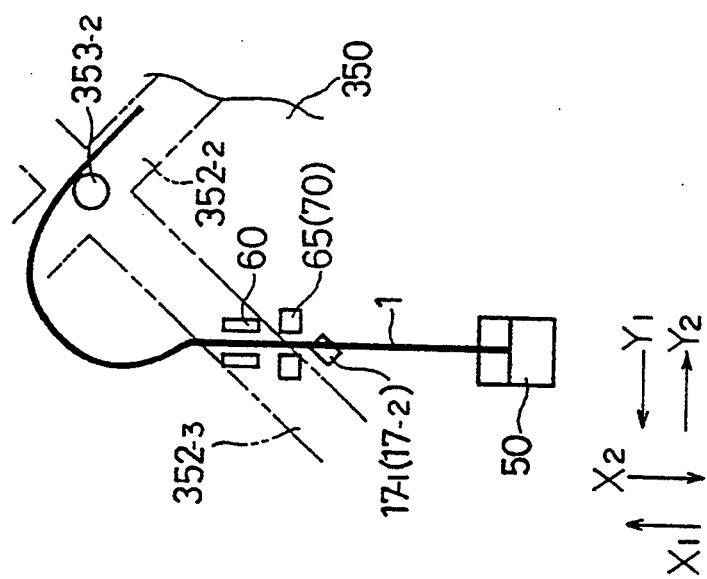

(3) Step 388 (FIG. 56B)

The wire clamper 48 is operated so that the twin wires 1 are clamped at the tension applying mechanism 50.

(4) Step 389 (FIG. 56B)

The step 32 is moved in the X1 direction and the twin wires 1 are cut at the slit for cutting.

(5) Step 372 for processing the remainder of the wires

This step is performed for the following reason. In FIG. 54, the wire connecting the pads 16-1 and 17-1 together is made to have a length L11 corresponding to a predetermined signal propagation time it takes the signal to be transferred between the pad 16-1 and the pad 17-1. Meanwhile, the distance measured along the wire routing path 352 between the pad 16-1 and the pad 17-1 is L12. Generally, L11 and L12 are not equal to each other, but L11>L12. Hence, a length (L11−L12) of the twin wires 1 is the remainder thereof. If the remainder of the twin wires 1 is out of the wire routing path 352, the mounting operation of IC chips is obstructed. Hence, a remainder processing step is performed in order to accommodate the remainder of the twin wires 1 in the wire routing path 352. More particularly, this step is performed as follows.

(1) Step 390

The stage 32 is moved so that the axis of rotation of the printed circuit board 10 is located just below the hand 60.

Figure 57A:
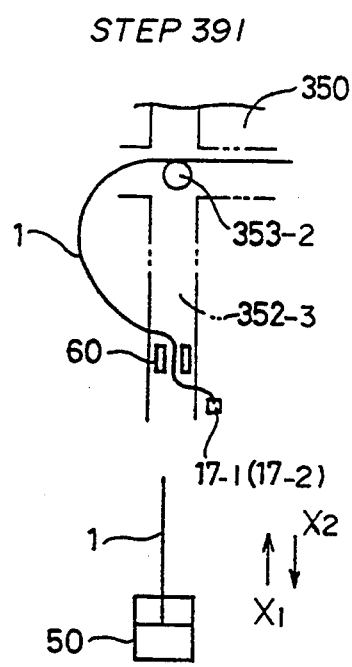
FIGS. 57A, 57B, 57C and 57D are diagrams of a step for processing the remainder of the twin wires.

(2) Step 391 (FIG. 57A)

The stage 32 is rotated counterclockwise by 45° so that the printed circuit 10 is rotated about the position of the hand 60 and the direction of the wire routing path 352-3 coincides with the X1 direction.

(3) Step 392 for Shaping the Wires into a U-shape

Figure 57B:
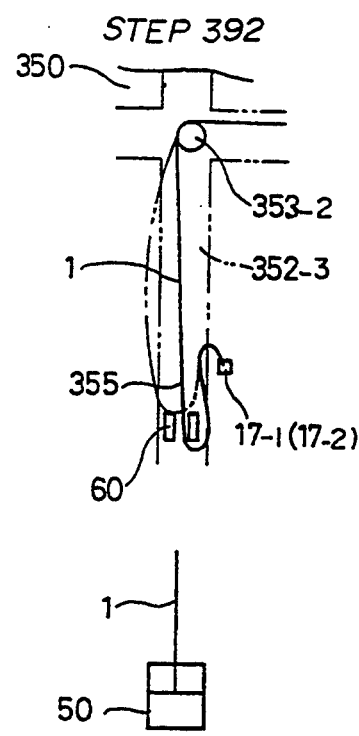

The stage 32 is moved in the X1 direction by a distance slightly less than half of (L11−L12). Hence, the printed circuit board 10 is moved in the X1 direction, and a part of the wires 1 bonded to the pad 17-1 is bent so that it is shaped into a U-shape in a state in which the wires 1 are held by the hand 60. If the hand 60 is released from the above state, the twin wires 1 will become detached from the wire routing path 352-3 due to flexibility of the bent wires, as indicated by a two-dot chained line shown in FIG. 57B. With the above in mind, the following steps are carried out.

Figure 57C:
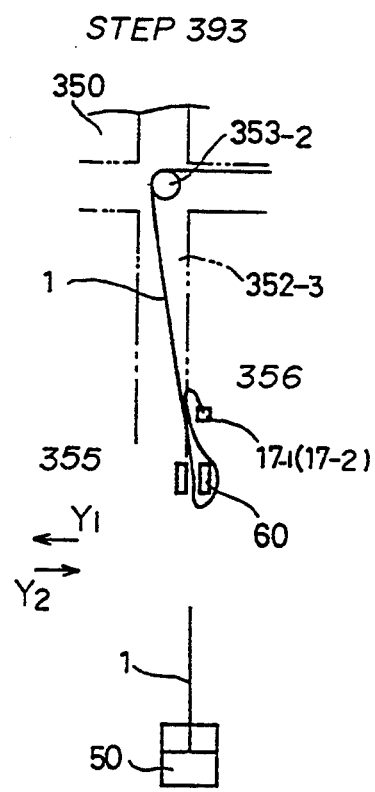

(4) Step 393 (FIG. 57C)

The stage 32 is slightly moved by a distance corresponding to the degree of restoration of the twin wires 1. Hence, the printed circuit board 10 is moved in the Y1 direction. Then, the hand 60 is moved outside of the wire routing path 352-3, and a U-shaped portion 355 (FIG. 57B) is bent towards the pad 17-1, as indicated by a reference number 356. The above takes into account a restore deformation of the twin wires 1 when the hand 60 is taken off therefrom.

Figure 57D:
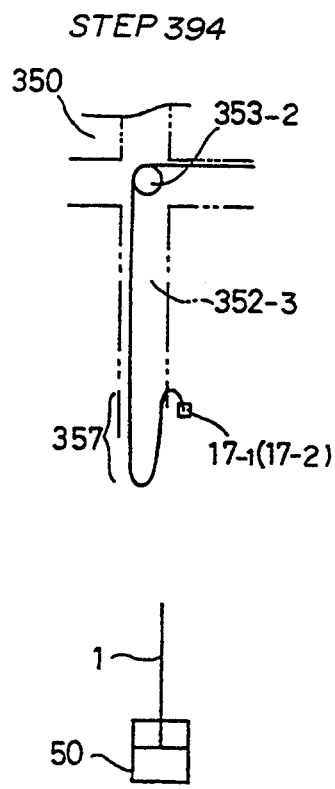

(5) Step 394 (FIG. 57D)

The hand 60 is taken off, so that the twin wires 1 are slightly deformed towards the original shape thereof due to flexibility of the wires 1. The twin wires 1 are subjected to remainder processing using a U-shaped portion 357, and the whole wires 1 including the U-shaped portion 357 are accommodated in the wire routing path 352-3.

Figure 58:
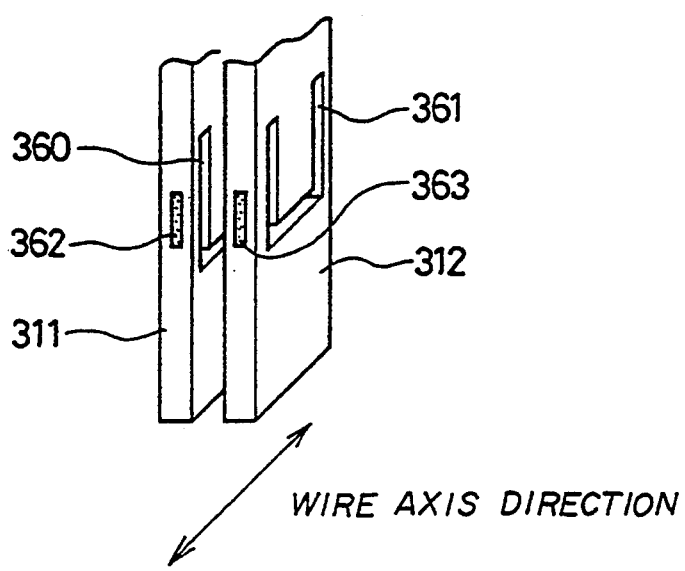
FIG. 58 is a perspective view of a finger portion of the hand 60 for twin wires shown in FIG. 5.

FIG. 58 shows the fingers 311 and 312 of the hand 60. As shown in FIG. 58, U-shaped slits 360 and 361 are respectively formed in the fingers 311 and 312. Strain gages 362 and 363 are formed in positions corresponding to the slits 360 and 361. The strain gages 362 and 363 detect the degrees of strains of the fingers 311 and 312. Using information concerning the degrees of strain of the fingers 311 and 312, a limit regarding the movement of the stage 23 is determined in order to prevent a cutting force (about 50 g) from being exerted on the twin wires 1.

The above remainder processing step can be applied to the printed circuit board 10 having the interposers 12-1 and 12-2. In this case, the wire routing paths are grooves, and restoring of the twin wires 1 are limited by the grooves. Hence, the above-mentioned steps 373 and 374 are not needed.

The present invention is not limited to the specifically disclosed embodiments, and variations and modifications may be made without departing from the scope of the present invention.

What is claimed is:

1. A wiring method comprising the steps of:
    (a) splitting a portion of a coated parallel twin wire member, composed of two coated single wires joined together in parallel form and fed from a wire rounding member, into the two coated single wires and removing a part of a coating of each of the coated single wires;
    (b) separating the two coated single wires by relatively moving a first block having a first groove, accommodating one of the two coated single wires, and a second block having a second groove, accommodating the other one of the two coated single wires;
    (c) separately holding the two coated single wires separated from each other; and
    (d) bonding portions of the two coated single wires, from which coatings have been removed, to two terminals provided on a body on which the coated single wires are to be arranged.

2. The wiring method as claimed in claim 1, wherein the step (b) comprises the step of moving the first and second blocks from a first position, where the first and second grooves face each other, to a second position where the first and second grooves do not face each other.

3. A wiring method comprising the steps of:
(a) splitting a portion of a coated parallel twin wire member, composed of two coated single wires joined together in parallel form and fed from a wire rounding member, into the two coated single wires and removing a part of a coating of each of the coated single wires;
(b) separating the two coated single wires from each other by a first device;
(c) separately holding the two coated single wires separated from each other by a second device; and
(d) bonding portions of the two coated single wires, from which coatings have been removed, to two terminals provided on a body on which the coated single wires are to be arranged, said portions of the two coated single wires being located between the first device and the second device.

4. A wiring apparatus comprising:
preprocessing means for splitting a portion of a coated parallel twin wire member, composed of two coated single wires joined together in parallel form and fed from a wire rounding member, into the two coated single wires and removing a part of a coating of each of the coated single wires;
separating means, operatively associated with said preprocessing means, for separating the two coated single wires by relatively moving a first block having a first groove, accommodating one of the two coated single wires, and a second block having a second groove, accommodating the other one of the two coated single wires;
holding means, operatively associated with said separating means, for separately holding the two coated single wires separated from each other; and
bonding means, operatively associated with said holding means, for bonding portions of the two coated single wires, from which coatings have been removed, to two terminals provided on a body on which the coated single wires are to be arranged.

5. The wiring apparatus as claimed in claim 4, wherein the separating means comprises means for moving the first and second blocks from a first position, where the first and second grooves face each other, to a second position where the first and second grooves do not face each other.

6. The wiring apparatus as claimed in claim 4, further comprising pushing means, operatively associated with said bonding means, for pushing the coated parallel twin wire member having the bonding portions which have been bonded in a routing guide provided on said body.

7. The wiring apparatus as claimed in claim 4, further comprising wire tension applying mechanism means, operatively associated with said preprocessing means, located on an upstream side thereof in a direction in which the two coated single wires are transported, for applying a tension to the two coated single wires held by the holding means.

8. The wiring apparatus as claimed in claim 4, wherein:
the first groove of the first block has a size corresponding to said one of the two coated single wires; and
the second groove of the second block has a size corresponding to the other one of the two coated single wires.

9. The wiring apparatus as claimed in claim 4, wherein the separating means comprises means for moving either the first or second blocks from a first position, where the first and second grooves face each other, to a second position where the first and second grooves do not face each other.

10. The wiring apparatus as claimed in claim 4, wherein the separating means comprises means for moving both the first or second blocks from a first position, where the first and second grooves face each other, to a second position where the first and second grooves do not face each other.

11. The wiring apparatus as claimed in claim 4, wherein said preprocessing means comprises tearing means, operatively associated with said wire rounding member, for tearing a part of the coated parallel twin wire member.

12. The wiring apparatus as claimed in claim 11, wherein the preprocessing means comprises:
mark forming means, operatively associated with said tearing means, for forming a mark on the coated parallel twin wire member at a position distant from said part of the two coated single wires torn by said tearing means by a predetermined length; and
mark detecting means, operatively associated with said mark forming means, located at a predetermined position based on said separating means, for detecting said mark and for generating a signal which causes said separating means to operate.

13. The wiring apparatus as claimed in claim 4, wherein said bonding means comprises:
a wedge, operatively associated with said holding means, applying pressure to the coated single wires; and
a pair of wire cutting mechanisms, operatively associated with said wedge and symmetrically located with respect to an axis of said wedge and tilted so that axes of a pair of wire cutting members are inclined with respect to the axis of the wedge.

14. The wiring apparatus as claimed in claim 13, wherein said pair of wire cutting mechanisms respectively comprise:
a cutter, operatively associated with said wedge and having a rod member and a blade provided at an end of said rod member, the coated parallel twin wires being cut by a linear movement of said cutter;
an actuator, operatively associated with said cutter, linearly moving said cutter;
a parallel spring mechanism, operatively associated with said cutter and having two identical leaf springs joined together, said parallel spring mechanism being located so that surfaces of the two identical leaf springs are perpendicular to an axis of the cutter, one of the two identical leaf springs being fixed and the other one thereof being connected to said cutter, bending of the two identical leaf springs causing the linear movement of said cutter; and
a stopper located at a cutter stop position where the cutter comes into contact with the stopper.

15. The wiring apparatus as claimed in claim 4, wherein said holding means comprises a single-wire hand means, operatively associated with said separating means and detecting means, operatively associated with single-wire hand means, for detecting a contact pressure with which said single-wire hand means is in contact with the coated single wires.

16. The wiring apparatus as claimed in claim 4, wherein said holding means comprises means, operatively associated with said separating means, for separately grasping end portions of the two coated single wires.

17. A wiring apparatus comprising:
a splitting means for splitting a portion of a coated parallel twin wire member, composed of two coated single wires joined together in parallel form and fed from a wire rounding member, into the two coated single wires and removing a part of a coating of each of the coated single wires;

separating means, operatively associated with splitting means, for separating the two coated single wires from each other by a first device;

holding means, operatively associated with separating means, for separately holding the two coated single wires separated from each other by a second device; and bonding means, operatively associated with said holding means, for bonding portions of the two coated single wires, from which coatings have been removed, to two terminals provided on a body on which the coated single wires are to be arranged, said portions of the two coated single wires being located between the first device and the second device.

18. The wiring apparatus as claimed in claim 17, further comprising wire tension applying mechanism means, operatively associated with said splitting means and located on an upstream side thereof in a direction in which the two coated single wires are transported, for applying a tension to the two coated single wires held by the holding means.

19. The wiring apparatus as claimed in claim 17, wherein said holding means comprises means, operatively associated with said separating means, for separately grasping end portions of the two coated single wires.

* * * * *